United States Patent
Furue et al.

(10) Patent No.: US 11,557,734 B2
(45) Date of Patent: Jan. 17, 2023

(54) ORGANIC ELECTROLUMINESCENCE DEVICE AND POLYCYCLIC COMPOUND FOR ORGANIC ELECTROLUMINESCENCE DEVICE

(71) Applicant: Samsung Display Co., Ltd., Yongin-si (KR)

(72) Inventors: Ryuhei Furue, Fukuoka (JP); Hirokazu Kuwabara, Fukuoka (JP)

(73) Assignee: Samsung Display Co., Ltd., Yongin-si (KR)

( * ) Notice: Subject to any disclaimer, the term of this patent is extended or adjusted under 35 U.S.C. 154(b) by 260 days.

(21) Appl. No.: 17/085,124

(22) Filed: Oct. 30, 2020

(65) Prior Publication Data
US 2021/0313521 A1 Oct. 7, 2021

(30) Foreign Application Priority Data
Mar. 27, 2020 (KR) .................. 10-2020-0037415

(51) Int. Cl.
*H01L 51/00* (2006.01)
*H01L 51/50* (2006.01)
*H01L 51/52* (2006.01)

(52) U.S. Cl.
CPC ...... *H01L 51/0072* (2013.01); *H01L 51/0067* (2013.01); *H01L 51/5012* (2013.01); *H01L 51/5237* (2013.01)

(58) Field of Classification Search
CPC ............ H01L 51/0072; H01L 51/0067; H01L 51/5012; H01L 51/5237
See application file for complete search history.

(56) References Cited

U.S. PATENT DOCUMENTS

| | | |
|---|---|---|
| 8,932,731 B2 | 1/2015 | Parham et al. |
| 2019/0256538 A1 | 8/2019 | Hatakeyama et al. |
| 2019/0378997 A1 | 12/2019 | Ishikawa et al. |

FOREIGN PATENT DOCUMENTS

| | | |
|---|---|---|
| DE | 198 08 088 A1 | 8/1999 |
| JP | 2012-507507 A | 3/2012 |

(Continued)

OTHER PUBLICATIONS

Yuan, Yi., et al., "The Design of Fused Amine/Carbonyl System for Efficient Thermally Activated Delayed Fluorescence: Novel Multiple Resonance Core and Electron Acceptor", *Advanced Optical Materials*, 2019, vol. 7, Issue 7, 1801536, 6pp.

*Primary Examiner* — Victor A Mandala
*Assistant Examiner* — Colleen E Snow
(74) *Attorney, Agent, or Firm* — Lewis Roca Rothgerber Christie LLP

(57) ABSTRACT

An organic electroluminescence device includes a first electrode, a second electrode, and an emission layer disposed between the first electrode and the second electrode, wherein the emission layer includes a polycyclic compound having a fused ring system and represented by Formula 1 to achieve (Continued)

high efficiency and improved efficiency drop characteristics in an emission wavelength range:

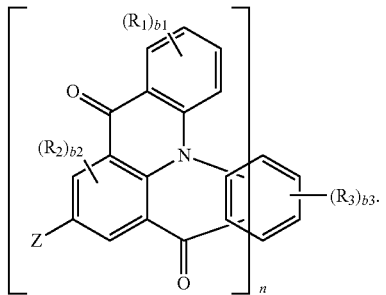

Formula 1

20 Claims, 2 Drawing Sheets

(56) References Cited

FOREIGN PATENT DOCUMENTS

| JP | 5813707 B2 | 11/2015 |
|---|---|---|
| KR | 10-1506919 B1 | 3/2015 |
| KR | 10-2019 0051003 A | 5/2019 |
| WO | WO 2018/047639 A1 | 3/2018 |
| WO | WO 2018/159662 A1 | 9/2018 |
| WO | WO 2018/212169 A1 | 11/2018 |

ORGANIC ELECTROLUMINESCENCE DEVICE AND POLYCYCLIC COMPOUND FOR ORGANIC ELECTROLUMINESCENCE DEVICE

CROSS-REFERENCE TO RELATED APPLICATION

This application claims priority to and the benefit of Korean Patent Application No. 10-2020-0037415, filed on Mar. 27, 2020, the entire content of which is hereby incorporated by reference.

BACKGROUND

One or more aspects of embodiments of the present disclosure relate to an organic electroluminescence device and a polycyclic compound used therein.

Organic electroluminescence displays are actively being developed as image display apparatuses. Unlike liquid crystal displays, organic electroluminescence displays are so-called self-luminescent display apparatuses, in which holes and electrons respectively injected from a first electrode and a second electrode recombine in an emission layer, and a luminescent organic compound in the emission layer emits light to implement display.

Organic electroluminescence devices having high luminous efficiency and/or long life span are desired for display applications, and new materials for an organic electroluminescence device capable of stably attaining such characteristics are desired.

In recent years, in order to implement a highly efficient organic electroluminescence device, technologies pertaining to phosphorescence emission (which uses energy in a triplet state) and/or delayed fluorescence emission (which uses singlet excitons generated by the collision of triplet excitons (triplet-triplet annihilation, TTA)) are being developed, and materials for thermally activated delayed fluorescence (TADF) are being developed.

SUMMARY

One or more aspects of embodiments of the present disclosure are directed toward an organic electroluminescence device exhibiting excellent luminous efficiency.

One or more aspects of embodiments of the present disclosure are directed toward a polycyclic compound as a material for an organic electroluminescence device having high efficiency characteristics.

One or more example embodiments of the present disclosure provide an organic electroluminescence device including a first electrode, a second electrode disposed on the first electrode, and an emission layer disposed between the first electrode and the second electrode, and including a polycyclic compound represented by Formula 1, wherein the first electrode and the second electrode each independently include any one selected from among silver (Ag), magnesium (Mg), copper (Cu), aluminum (Al), platinum (Pt), palladium (Pd), gold (Au), nickel (Ni), neodymium (Nd), iridium (Ir), chromium (Cr), lithium (Li), calcium (Ca), LiF/Ca, LiF/Al, molybdenum (Mo), titanium (Ti), indium (In), zinc (Zn), tin (Sn), and ytterbium (Yb), a compound of two or more thereof, a mixture of two or more thereof, or an oxide thereof:

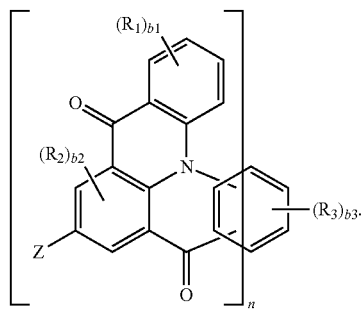

Formula 1

In Formula 1, n may be 1 or 2, Z may be a substituent including at least one fluorine group or at least one cyano group, or an aromatic ring group including at least one nitrogen atom as a ring-forming atom, b1 and b3 may each independently be an integer of 1 to 4, b2 may be 1 or 2, and $R_1$ to $R_3$ may each independently be a hydrogen atom, a deuterium atom, a halogen atom, a substituted or unsubstituted oxy group, a substituted or unsubstituted alkyl group having 1 to 20 carbon atoms, a substituted or unsubstituted aryl group having 6 to 30 ring-forming carbon atoms, or a substituted or unsubstituted heteroaryl group having 3 to 30 ring-forming carbon atoms.

Z may be a cyano group, a fluorine group, an alkyl group substituted with at least one fluorine group, a phenyl group substituted with at least one cyano group or at least one trifluoromethyl group, a substituted or unsubstituted pyridine group, a substituted or unsubstituted pyrimidine group, or a substituted or unsubstituted triazine group.

Formula 1 may be represented by Formula 2 or Formula 3:

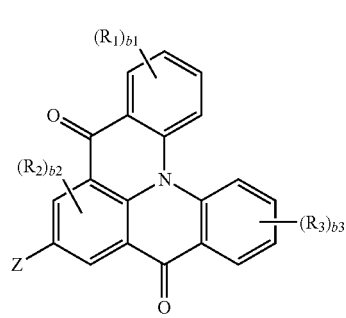

Formula 2

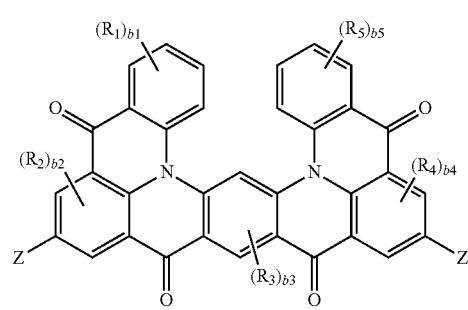

Formula 3

In Formula 3, $Z_1$ and $Z_2$ may each independently be a substituent including at least one fluorine group or at least one cyano group, or an aromatic ring group including at least one nitrogen atom as a ring-forming atom, b4 may be 1 or 2, b5 may be an integer of 1 to 4, $R_4$ and $R_5$ may each independently be a hydrogen atom, a deuterium atom, a halogen atom, a substituted or unsubstituted oxy group, a substituted or unsubstituted alkyl group having 1 to 20 carbon atoms, a substituted or unsubstituted aryl group having 6 to 30 ring-forming carbon atoms, or a substituted or unsubstituted heteroaryl group having 3 to 30 ring-forming carbon atoms, and in Formulas 2 and 3, b1 to b3, $R_1$ to $R_3$, and Z may each independently be the same as defined in Formula 1.

Formula 2 may be represented by Formula 2-1:

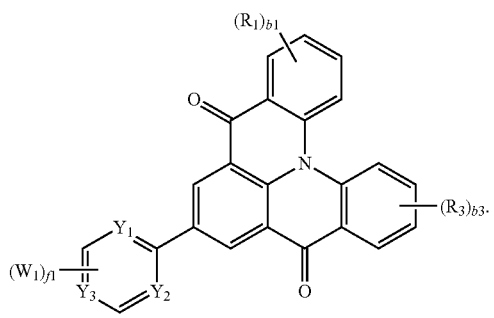

Formula 2-1

In Formula 2-1, f1 may be 1 or 2, $Y_1$ to $Y_3$ may each independently be a nitrogen atom or $CW_2$, $W_1$ and $W_2$ may each independently be a hydrogen atom, a deuterium atom, a halogen atom, a cyano group, a substituted or unsubstituted alkyl group having 1 to 20 carbon atoms, or a substituted or unsubstituted aryl group having 6 to 30 ring-forming carbon atoms, and b1, b3, $R_1$ and $R_3$ may each independently be the same as defined in Formula 2.

Formula 3 may be represented by Formula 3-1:

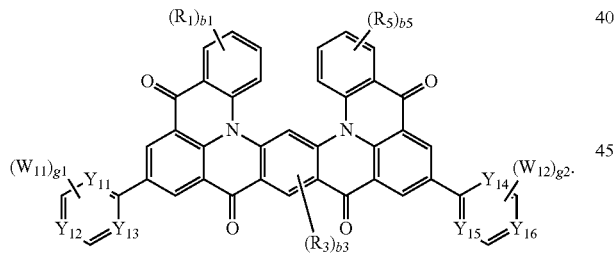

Formula 3-1

In Formula 3-1, $Y_{11}$ to $Y_{16}$ may each independently be a nitrogen atom or $CW_{13}$, g1 and g2 may each independently be 1 or 2, $W_{11}$ to $W_{13}$ may each independently be a hydrogen atom, a deuterium atom, a halogen atom, a cyano group, a substituted or unsubstituted alkyl group having 1 to 20 carbon atoms, or a substituted or unsubstituted aryl group having 6 to 30 ring-forming carbon atoms, and b1, b3, b5, $R_1$, $R_3$, and $R_5$ may each independently be the same as defined in Formula 3.

Z may be represented by any one of Z-1 to Z-13:

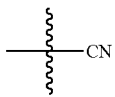

Z-1

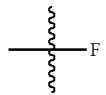

Z-2

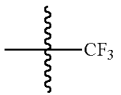

Z-3

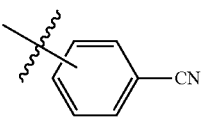

Z-4

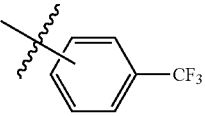

Z-5

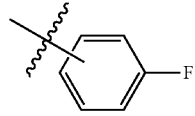

Z-6

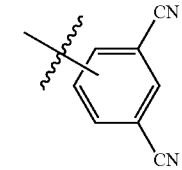

Z-7

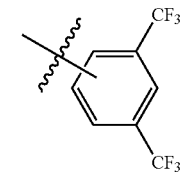

Z-8

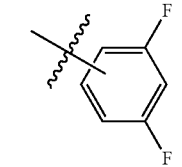

Z-9

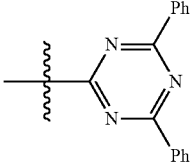

Z-10

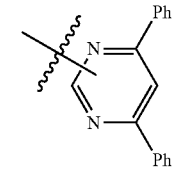

Z-11

-continued

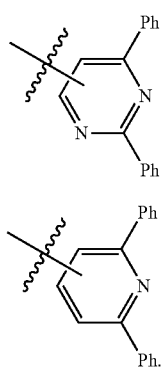

In Z-10 to Z-13, Ph is a phenyl group.

Formula 1 may be represented by Formula 1-A or Formula 1-B:

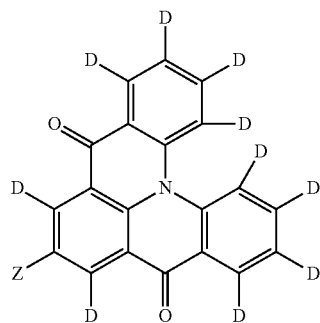

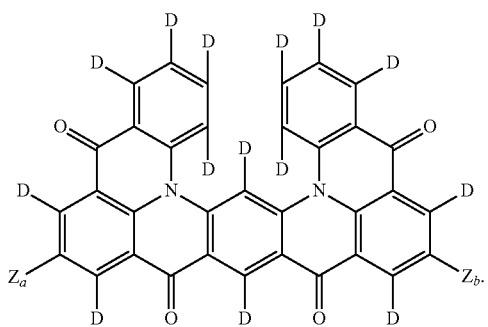

In Formula 1-B, $Z_a$ and $Z_b$ may each independently be a substituent including at least one fluorine group or at least one cyano group, or an aromatic ring group including at least one nitrogen atom as a ring-forming atom, and in Formula 1-A, Z may be the same as defined in Formula 1.

In some embodiments, the organic electroluminescence device may further include a capping layer on the second electrode, and the capping layer may have a refractive index of about 1.6 or more.

The emission layer may be to emit delayed fluorescence.

The emission layer may be to emit light having a central wavelength of about 430 nm to about 470 nm.

One or more example embodiments of the present disclosure provide a polycyclic compound represented by Formula 1.

BRIEF DESCRIPTION OF THE DRAWINGS

The accompanying drawings are included to provide a further understanding of the present disclosure, and are incorporated in and constitute a part of this specification. The drawings illustrate example embodiments of the present disclosure and, together with the description, serve to explain principles of the present disclosure. In the drawings.

DETAILED DESCRIPTION

Figure 1:
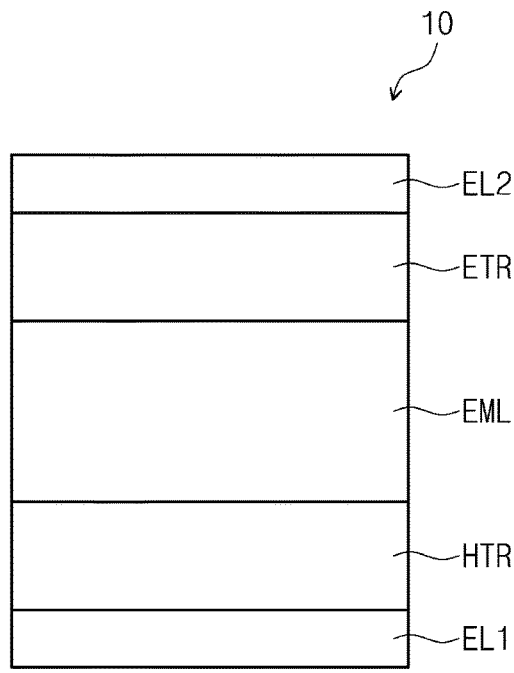
FIG. 1 is a cross-sectional view schematically illustrating an organic electroluminescence device according to an embodiment of the present disclosure.

The present disclosure may be modified to have many alternate forms, and thus selected embodiments will be illustrated in the drawings and described in more detail. It should be understood, however, that the description is not intended to limit the present disclosure to the particular forms disclosed, but rather, is intended to cover all modifications, equivalents, and alternatives falling within the spirit and scope of the present disclosure.

In the present disclosure, when an element (or a region, a layer, a portion, etc.) is referred to as being "on," "connected to," or "coupled to" another element, it means that the element may be directly disposed on/connected to/coupled to the other element, or that a third element may be disposed therebetween. When an element is referred to as being "directly on," "directly connected to," or "directly coupled to" another element, there are no intervening elements present.

Like reference numerals refer to like elements throughout, and duplicative descriptions thereof may not be provided. Also, in the drawings, the thickness, the ratio, and the dimensions of elements may be exaggerated for an effective description of technical contents.

As used herein, the singular forms "a," "an," and "the" are intended to include the plural forms as well, unless the context clearly indicates otherwise. The term "and/or" includes any and all combinations of one or more of the associated listed items. Further, the use of "may" when describing embodiments of the present disclosure refers to "one or more embodiments of the present disclosure".

It will be understood that, although the terms "first", "second", etc. may be used herein to describe various elements, these elements should not be limited by these terms. These terms are only used to distinguish one element from another. For example, a first element could be alternatively termed a second element, and, similarly, a second element could be alternatively termed a first element, without departing from the scope of example embodiments of the present disclosure. The terms of a singular form may include plural forms unless the context clearly indicates otherwise.

In addition, terms such as "below," "lower," "above," "upper," and/or the like are used to describe the relationship of the configurations shown in the drawings. The terms are used as relative concepts, and are described with reference to the direction indicated in the drawings.

Unless otherwise defined, all terms (including technical and scientific terms) used herein have the same meaning as commonly understood by those of ordinary skill in the art to which the present disclosure pertains. It is also to be understood that terms defined in commonly used dictionaries should be interpreted as having meanings consistent with the meanings in the context of the related art, unless expressly defined herein, and should not be interpreted in an ideal or overly formal sense.

It should be understood that the terms "includes," "including," "comprises," "comprising," and/or "have" are intended to specify the presence of stated features, integers, steps, operations, elements, components, or combinations thereof in the disclosure, but do not preclude the presence or addition of one or more other features, integers, steps, operations, elements, components, or combinations thereof.

Hereinafter, organic electroluminescence devices according to embodiments of the present disclosure and polycyclic compounds included therein will be described with reference to the accompanying drawings.

FIGS. 1 to 4 are cross-sectional views schematically illustrating organic electroluminescence devices according to embodiments of the present disclosure. Referring to FIGS. 1 to 4, in each of the organic electroluminescence devices 10 according to embodiments, a first electrode EL1 and a second electrode EL2 are disposed to face each other and an emission layer EML is disposed between the first electrode EL1 and the second electrode EL2.

The organic electroluminescence devices 10 each further include a plurality of organic layers between the first electrode EL1 and the second electrode EL2 in addition to the emission layer EML. The plurality of organic layers may include a hole transport region HTR and an electron transport region ETR. For example, the organic electroluminescence devices 10 according to embodiments may each include the first electrode EL1, the hole transport region HTR, the emission layer EML, the electron transport region ETR, and the second electrode EL2, sequentially stacked. In some embodiments, the organic electroluminescence device 10 of an embodiment may include a capping layer CPL disposed on the second electrode EL2.

Figure 2:
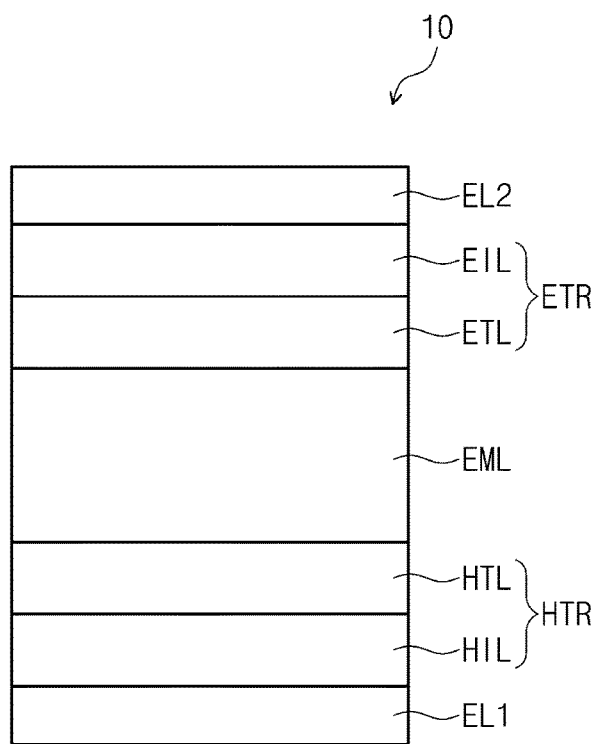
FIG. 2 is a cross-sectional view schematically illustrating an organic electroluminescence device according to an embodiment of the present disclosure.
Figure 3:
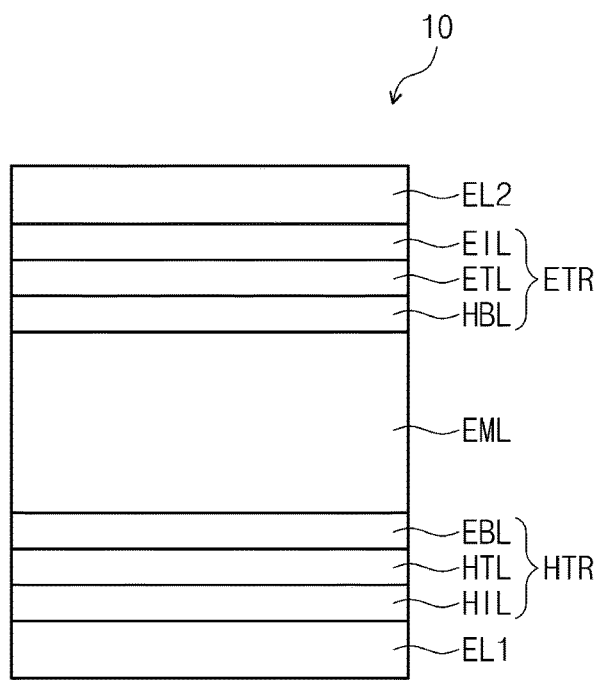
FIG. 3 is a cross-sectional view schematically illustrating an organic electroluminescence device according to an embodiment of the present disclosure.
Figure 4:
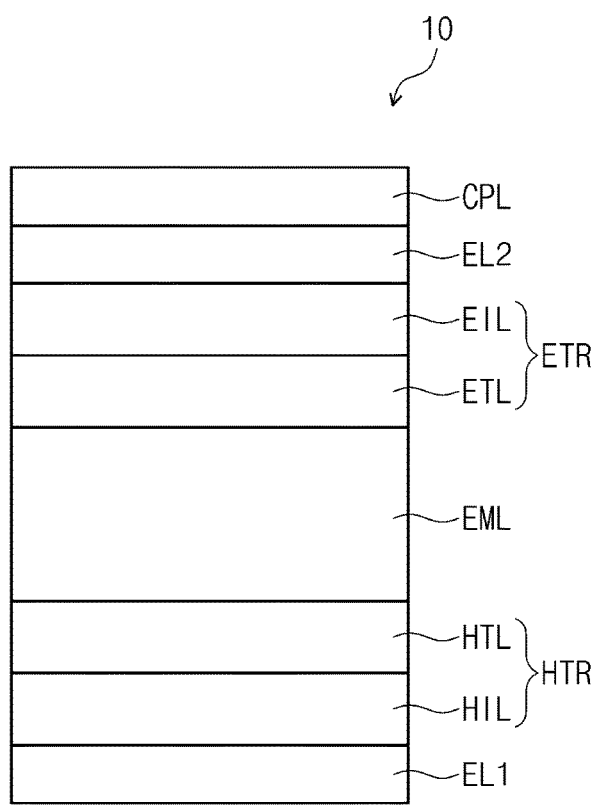
FIG. 4 is a cross-sectional view schematically illustrating an organic electroluminescence device according to an embodiment of the present disclosure.

Compared to FIG. 1, FIG. 2 illustrates a cross-sectional view of an organic electroluminescence device 10 of an embodiment, in which the hole transport region HTR includes a hole injection layer HIL and a hole transport layer HTL, and the electron transport region ETR includes an electron injection layer EIL and an electron transport layer ETL. Compared to FIG. 1, FIG. 3 illustrates a cross-sectional view of an organic electroluminescence device 10 of an embodiment, in which the hole transport region HTR includes the hole injection layer HIL, the hole transport layer HTL, and an electron blocking layer EBL, and the electron transport region ETR includes the electron injection layer EIL, the electron transport layer ETL, and a hole blocking layer HBL. Compared to FIG. 2, FIG. 4 illustrates a cross-sectional view of an organic electroluminescence device 10 of an embodiment including a capping layer CPL disposed on the second electrode EL2.

The first electrode EL1 may have conductivity. The first electrode EL1 may be formed of a metal alloy and/or a conductive compound. The first electrode EL1 may be an anode. In some embodiments, the first electrode EL1 may be a pixel electrode. The first electrode EL1 may be a transmissive electrode, a transflective electrode, or a reflective electrode. When the first electrode EL1 is a transmissive electrode, the first electrode EL1 may include a transparent metal oxide (such as indium tin oxide (ITO), indium zinc oxide (IZO), zinc oxide (ZnO), and/or indium tin zinc oxide (ITZO)). When the first electrode EL1 is a transflective electrode or the reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, In, Zn, Sn, Yb, a compound thereof, or a mixture thereof (e.g., a mixture of Ag and Mg). In some embodiments, the first electrode EL1 may have a multilayer structure including a reflective film or a transflective film formed of the above-described materials, and a transparent conductive film formed of indium tin oxide (ITO), indium zinc oxide (IZO), zinc oxide (ZnO), indium tin zinc oxide (ITZO), etc. For example, the first electrode EL1 may have a three-layer structure of ITO/Ag/ITO, but is not limited thereto. The thickness of the first electrode EL1 may be about 1,000 Å to about 10,000 Å, for example, about 1,000 Å to about 3,000 Å.

The hole transport region HTR is provided on the first electrode EL1. The hole transport region HTR may include at least one of a hole injection layer HIL, a hole transport layer HTL, a hole buffer layer, or an electron blocking layer EBL. The thickness of the hole transport region HTR may be, for example, about 50 Å to about 15,000 Å.

The hole transport region HTR may have a single layer formed of a single material, a single layer formed of a plurality of different materials, or a multilayer structure including a plurality of layers formed of a plurality of different materials.

For example, the hole transport region HTR may have a single layer structure of a hole injection layer HIL or a hole transport layer HTL, or may have a single layer structure formed of a hole injection material and a hole transport material. In some embodiments, the hole transport region HTR may have a single layer structure formed of a plurality of different materials, or a structure in which a hole injection layer HIL/hole transport layer HTL, a hole injection layer HIL/hole transport layer HTL/hole buffer layer, a hole injection layer HIL/hole buffer layer, a hole transport layer HTL/hole buffer layer, or a hole injection layer HIL/hole transport layer HTL/electron blocking layer EBL are stacked in order from the first electrode EL1, but embodiments are not limited thereto.

The hole transport region HTR may be formed using any suitable method (such as a vacuum deposition method, a spin coating method, a cast method, a Langmuir-Blodgett (LB) method, an inkjet printing method, a laser printing method, and/or a laser induced thermal imaging (LITI) method).

The hole injection layer HIL may include, for example, a phthalocyanine compound (such as copper phthalocyanine), amino)-phenyl]-biphenyl-4,4'-diamine (DNTPD), 4,4',4''-[tris(3-methylphenyl)phenylamino]triphenylamine] (m-MTDATA), 4,4',4''-tris(N,N-diphenylamino)triphenylamine (TDATA), 4,4',4''-tris{N,-(2-naphthyl)-N-phenylamino)-triphenylamine (2-TNATA), poly(3,4-ethylene dioxythiophene)/poly(4-styrene sulfonate) (PEDOT/PSS), polyaniline/dodecylbenzene sulfonic acid (PANI/DBSA), polyaniline/camphor sulfonic acid (PANI/CSA), polyaniline/poly(4-styrene sulfonate) (PANT/PSS), N,N'-di(naphthalene-1-yl)-N,N'-diphenyl-benzidine (NPB), triphenylamine-containing polyether ketone (TPAPEK), 4-isopropyl-4'-methyldiphenyliodonium tetrakis(pentafluorophenyl)borate, dipyrazino[2,3-f: 2',3'-h]quinoxaline-2,3,6,7,10,11-hexacarbonitrile (HAT-CN), etc.

The hole transport layer HTL may further include, for example, a carbazole-based derivative (such as N-phenyl carbazole and/or polyvinyl carbazole), fluorene-based derivatives, N,N'-bis(3-methylphenyl)-N,N'-diphenyl-[1,1- biphenyl]-4,4'-diamine (TPD), triphenylamine-based derivatives (such as 4,4',4''-tris(N-carbazolyl)triphenylamine (TCTA)), N,N'-di(1-naphthalene-1-yl)-N,N'-diphenyl-benzidine (NPB), 4,4'-cyclohexylidene bis[N,N-bis(4-methylphenyl]benzenamine] (TAPC), 4,4'-bis[N,N'-(3-tolyl) amino]-3,3'-dimethylbiphenyl (HMTPD), 1,3-bis(N-carbazolyl)benzene (mCP), etc.

The thickness of the hole transport region HTR may be about 50 Å to about 10,000 Å, for example, about 100 Å to about 5,000 Å. The thickness of the hole injection layer HIL may be, for example, about 30 Å to about 1,000 Å, and the thickness of the hole transport layer HTL may be about 30 Å to about 1,000 Å. For example, the thickness of the electron blocking layer EBL may be about 10 Å to about 1,000 Å. When the thicknesses of the hole transport region HTR, the hole injection layer HIL, the hole transport layer HTL and the electron blocking layer EBL satisfy the above-described ranges, satisfactory hole transport properties may be achieved without a substantial increase in driving voltage.

The hole transport region HTR may further include, in addition to the above-described materials, a charge generating material to increase conductivity. The charge generating material may be dispersed substantially uniformly or non-uniformly in the hole transport region HTR. The charge generating material may be, for example, a p-dopant. The p-dopant may be selected from quinone derivatives, metal oxides, are cyano group-containing compounds, but is not limited thereto. Non-limiting examples of the p-dopant include quinone derivatives (such as tetracyanoquinodimethane (TCNQ) and/or 2,3,5,6-tetrafluoro-7,7,8,8-tetracyanoquinodimethane (F4-TCNQ)), metal oxides (such as tungsten oxide and/or molybdenum oxide), etc., but is not limited thereto.

As described above, the hole transport region HTR may further include at least one of a hole buffer layer or an electron blocking layer EBL in addition to the hole injection layer HIL and the hole transport layer HTL. The hole buffer layer may compensate for a resonance distance of the wavelength of light emitted from an emission layer EML to increase light emission efficiency. Materials that may be included in the hole transport region HTR may be included in the hole buffer layer. The electron blocking layer EBL is a layer that serves to prevent or reduce electrons from being injected from the electron transport region ETR to the hole transport region HTR.

The emission layer EML is provided on the hole transport region HTR. The thickness of the emission layer EML may be, for example, about 100 Å to about 1000 Å or about 100 Å to about 400 Å. The emission layer EML may have a single layer formed of a single material, a single layer formed of a plurality of different materials, or a multilayer structure having a plurality of layers formed of a plurality of different materials.

In an organic electroluminescence device 10 of an embodiment, the emission layer EML may include a polycyclic compound of an embodiment.

In the present description, the term "substituted or unsubstituted" may refer to a state of being unsubstituted, or of being substituted with at least one substituent selected from the group consisting of a deuterium atom, a halogen atom, a cyano group, a nitro group, an amine group, a silyl group, an oxy group, a thio group, a sulfinyl group, a sulfonyl group, a carbonyl group, a boron group, a phosphine oxide group, a phosphine sulfide group, an alkyl group, an alkenyl group, an alkynyl group, an alkoxy group, a hydrocarbon ring group, an aryl group, and a heterocyclic group. In some embodiments, each of the listed substituents may be further substituted or unsubstituted. For example, a biphenyl group may be interpreted as an aryl group, or as a phenyl group substituted with a phenyl group.

In the present description, non-limiting examples of a halogen atom include a fluorine atom, a chlorine atom, a bromine atom, and an iodine atom.

In the present description, an alkyl group may be a linear, branched or cyclic alkyl group. The number of carbon atoms in the alkyl group may be 1 to 50, 1 to 30, 1 to 20, 1 to 10, or 1 to 6. Non-limiting examples of the alkyl group include a methyl group, an ethyl group, an n-propyl group, an isopropyl group, an n-butyl group, a s-butyl group, a t-butyl group, an i-butyl group, a 2-ethylbutyl group, a 3,3-a dimethylbutyl group, an n-pentyl group, an i-pentyl group, a neopentyl group, a t-pentyl group, a cyclopentyl group, a 1-methylpentyl group, a 3-methylpentyl group, a 2-ethylpentyl group, a 4-methyl-2-pentyl group, an n-hexyl group, a 1-methylhexyl group, a 2-ethylhexyl group, a 2-butylhexyl group, a cyclohexyl group, a 4-methylcyclohexyl group, a 4-t-butylcyclohexyl group, an n-heptyl group, a 1-methylheptyl group, a 2,2-dimethylheptyl group, a 2-ethylheptyl group, a 2-butylheptyl group, an n-octyl group, a t-octyl group, a 2-ethyloctyl group, a 2-butyloctyl group, a 2-hexyloctyl group, a 3,7-dimethyloctyl group, a cyclooctyl group, an n-nonyl group, an n-decyl group, an adamantyl group, a 2-ethyldecyl group, a 2-butyldecyl group, a 2-hexyldecyl group, a 2-octyldecyl group, an n-undecyl group, an n-dodecyl group, a 2-ethyldodecyl group, a 2-butyldodecyl group, a 2-hexyldocecyl group, a 2-octyldodecyl group, an n-tridecyl group, an n-tetradecyl group, an n-pentadecyl group, an n-hexadecyl group, a 2-ethylhexadecyl group, a 2-butylhexadecyl group, a 2-hexylhexadecyl group, a 2-octylhexadecyl group, an n-heptadecyl group, an n-octadecyl group, an n-nonadecyl group, an n-eicosyl group, a 2-ethyleicosyl group, a 2-butyleicosyl group, a 2-hexyleicosyl group, a 2-octyleicosyl group, an n-henicosyl group, an n-docosyl group, an n-tricosyl group, an n-tetracosyl group, an n-pentacosyl group, an n-hexacosyl group, an n-heptacosyl group, an n-octacosyl group, an n-nonacosyl group, an n-triacontyl group, etc.

In the present description, an aromatic ring group may be an aryl group, or a heteroaryl group derived from an aromatic hydrocarbon ring.

In the present description, an aryl group may be any functional group or substituent derived from an aromatic hydrocarbon ring. The aryl group may be a monocyclic aryl group or a polycyclic aryl group. The number of ring-forming carbon atoms in the aryl group may be 6 to 30, 6 to 20, or 6 to 15. Non-limiting examples of the aryl group include a phenyl group, a naphthyl group, a fluorenyl group, an anthracenyl group, a phenanthryl group, a biphenyl group, a terphenyl group, a quaterphenyl group, a quinquephenyl group, a sexiphenyl group, a triphenylenyl group, a pyrenyl group, a benzofluoranthenyl group, a chrysenyl group, etc.

In the present description, a heteroaryl group may include at least one of boron (B), oxygen (O), nitrogen (N), phosphorus (P), silicon (Si), or sulfur (S) as a heteroatom. When the heteroaryl group contains two or more heteroatoms, the two or more heteroatoms may be the same as or different from each other. The heteroaryl group may be a monocyclic heteroaryl group or a polycyclic heteroaryl group. The number of ring-forming carbon atoms in the heteroaryl group may be 2 to 30, 2 to 20, or 2 to 10. Non-limiting examples of the heteroaryl group include a thiophene group, a furan group, a pyrrole group, an imidazole group, a triazole group, a pyridine group, a bipyridine group, a pyrimidine group, a triazine group, a triazole group, an acridyl group, a pyridazine group, a pyrazinyl group, a quinoline group, a quinazoline group, a quinoxaline group, a phenoxazine group, a phthalazine group, a pyrido pyrimidine group, a pyrido pyrazine group, a pyrazino pyrazine group, an isoquinoline group, an indole group, a carbazole group, an N-arylcarbazole group, an N-heteroarylcarbazole group, an N-alkylcarbazole group, a benzoxazole group, a benzimidazole group, a benzothiazole group, a benzocarbazole group, a benzothiophene group, a dibenzothiophene group, a thienothiophene group, a benzofuran group, a phenanthroline group, a thiazole group, an isoxazole group, an oxazole group, an oxadiazole group, a thiadiazole group, a phenothiazine group, a dibenzosilole group, a dibenzofuran group, etc.

In the present description, an oxy group may be an alkoxy group or an aryl oxy group.

In the present description, an alkoxy group may include a linear, branched, or cyclic alkyl group. The number of carbon atoms in the alkoxy group is not particularly limited, but for example, may be 1 to 20 or 1 to 10. Non-limiting examples of an oxy group include methoxy, ethoxy, n-propoxy, isopropoxy, butoxy, pentyloxy, hexyloxy, octyloxy, nonyloxy, decyloxy, benzyloxy, etc.

In the present description,

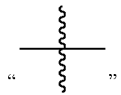

" " refers to a position to be connected.

An emission layer EML of an organic electroluminescence device 10 of an embodiment may include a polycyclic compound of an embodiment represented by Formula 1:

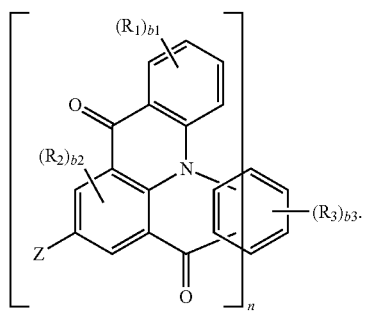

Formula 1

In Formula 1, n may be 1 or 2. For example, when n is 1, the polycyclic compound of an embodiment may be at least a 5-membered ring system, formed by fusing a 4-membered ring group to a benzene ring. When n is 2, the polycyclic compound of an embodiment may be at least a 9-membered ring group, formed by fusing two 4-membered ring groups to a (the same) benzene ring.

In Formula 1, Z may be a substituent including at least one fluorine group or at least one cyano group, or an aromatic ring group including at least one nitrogen atom as a ring-forming atom.

The substituent including at least one fluorine group or at least one cyano group may be a cyano group, a fluorine group, or e.g., an aryl or alkyl group including at least one cyano group and/or fluorine group as a substituent. For example, when Z includes a fluorine group as a substituent, Z may be a trifluoromethyl group, a phenyl group substituted with a trifluoromethyl group, or a phenyl group substituted with a fluorine group. When Z includes a cyano group as a substituent, Z may be a phenyl group substituted with a cyano group. However, this is an example, and embodiments are not limited thereto.

Z may be a cyano group, a fluorine group, an alkyl group substituted with at least one fluorine group, a phenyl group substituted with at least one cyano group or at least one trifluoromethyl group, a substituted or unsubstituted pyridine group, a substituted or unsubstituted pyrimidine group, or a substituted or unsubstituted triazine group. Z may be an electron withdrawing group.

For example, Z may be a fluorine group or a cyano group. Z may be a methyl group substituted with a fluorine group (e.g., a fluoromethyl group), or a phenyl group substituted with one or two cyano groups (e.g., a dicyanophenyl group). Z may be a phenyl group substituted with one or two trifluoromethyl groups (e.g., a trifluoromethylphenyl group or a bis-trifluoromethylphenyl group). Z may be a triazine group substituted with two phenyl groups, a pyrimidine group substituted with two phenyl groups, or a pyridine group substituted with two phenyl groups.

In Formula 1, b2 may be 1 or 2. b1 and b3 may each independently be an integer of 1 to 4. When b2 is 2, a plurality of $R_2$'s may be the same or different from each other. When b1 is an integer of 2 or more, a plurality of $R_1$'s may be the same or different from each other. When b3 is an integer of 2 or more, a plurality of $R_3$'s may be the same as or different from each other.

$R_1$ to $R_3$ may each independently be a hydrogen atom, a deuterium atom, a halogen atom, a substituted or unsubstituted oxy group, a substituted or unsubstituted alkyl group having 1 to 20 carbon atoms, a substituted or unsubstituted aryl group having 6 to 30 ring-forming carbon atoms, or a substituted or unsubstituted heteroaryl group having 3 to 30 ring-forming carbon atoms.

For example, when b1 is 4, a plurality of $R_1$'s may be the same. For example, the four $R_1$'s may all be deuterium atoms. When b3 is 2, a plurality of $R_3$'s may all be the same. For example, the two $R_3$'s may all be deuterium atoms. However, this is an example, and embodiments are not limited thereto.

Meanwhile, Z may be represented by any one of Z-1 to Z-13. The polycyclic compound of an embodiment may include any one of Z-1 to Z-13 as an electron withdrawing group.

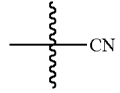

Z-1

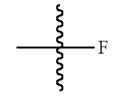

Z-2

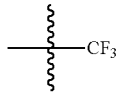

Z-3

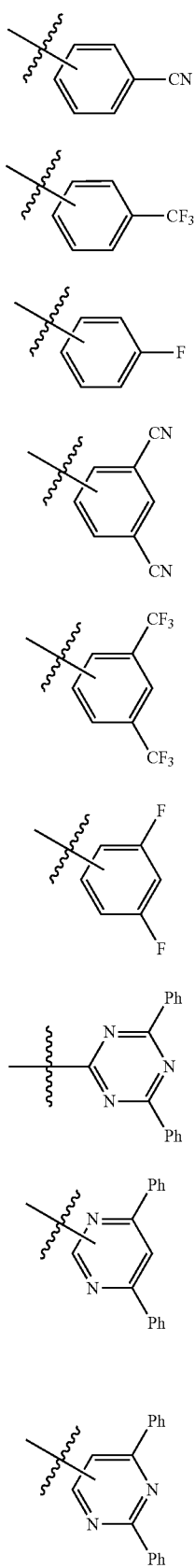

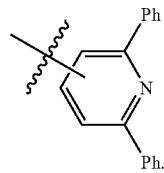

In Z-10 to Z-13, Ph is a phenyl group.

The polycyclic compound according to an embodiment may be used as a light emitting material to emit deep blue light having a central emission wavelength ($\lambda_{max}$) in a wavelength range of about 470 nm or less. For example, the polycyclic compound of an embodiment represented by Formula 1 may be a light emitting material having a central emission wavelength in a wavelength range of about 430 nm to about 470 nm.

According to an embodiment, Formula 1 may be represented by Formula 2. Formula 2 shows the case where n is 1, and the polycyclic compound of an embodiment is a 5-membered fused aromatic ring system is fused.

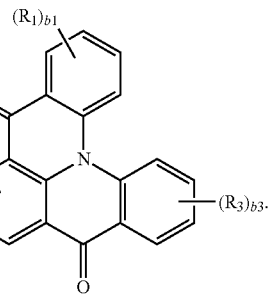

Formula 2

In Formula 2, b1 to b3, $R_1$ to $R_3$, and Z may each independently have the same descriptions as those described in Formula 1.

For example, b1 may be 4, and the four $R_1$'s may each be a hydrogen atom or a deuterium atom, and may be the same. b2 may be 2, and the two $R_2$'s may each be a hydrogen atom or a deuterium atom, and the two $R_2$'s may be the same. b3 may be 4, and the four $R_3$'s may each be a hydrogen atom or a deuterium atom, and may be the same. Z is an electron withdrawing group, and may include at least one nitrogen atom or a fluorine atom.

In some embodiments, Formula 2 may be represented by Formula 2-1:

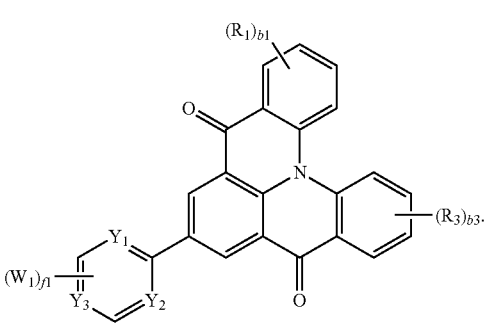

Formula 2-1

In Formula 2-1, $Y_1$ to $Y_3$ may each independently be a nitrogen atom or $CW_2$. For example, $Y_1$ to $Y_3$ may all be nitrogen atoms, or $CW_2$. One or two of $Y_1$ to $Y_3$ may be a nitrogen atom. When all of $Y_1$ to $Y_3$ are $CW_2$, or when two of $Y_1$ to $Y_3$ are $CW_2$, a plurality of $W_2$'s may be the same or different.

$W_1$ and $W_2$ may each independently be a hydrogen atom, a deuterium atom, a halogen atom, a cyano group, a substituted or unsubstituted alkyl group having 1 to 20 carbon atoms, or a substituted or unsubstituted aryl group having 6 to 30 ring-forming carbon atoms.

When all of $Y_1$ to $Y_3$ are $CW_2$, or when two of $Y_1$ to $Y_3$ are $CW_2$, a plurality of $W_2$ may all be hydrogen atoms. For example, when all of $Y_1$ to $Y_3$ are $CW_2$, a ring group including $Y_1$ to $Y_3$ may be a substituted phenyl group. The ring group including $Y_1$ to $Y_3$ may be a phenyl group substituted with at least one cyano group or at least one trifluoromethyl group.

When all of $Y_1$ to $Y_3$ are nitrogen atoms, the ring group including $Y_1$ to $Y_3$ may be a substituted or unsubstituted triazine group. When two of $Y_1$ to $Y_3$ are nitrogen atoms, the ring group including $Y_1$ to $Y_3$ may be a substituted or unsubstituted pyrimidine group. When one of $Y_1$ to $Y_3$ is a nitrogen atom, the ring group including Yi to $Y_3$ may be a substituted or unsubstituted pyridine group.

In Formula 2-1, f1 may be 1 or 2. When f1 is 2, the two $W_1$'s may all be the same as or different from each other. For example, f1 may be 2, and the two $W_1$'s may simultaneously be a cyano group, a fluorine group, a trifluoromethyl group, or a phenyl group.

In Formula 2-1, b1, b3, $R_1$, and $R_3$ may each independently have the same descriptions as those described in Formula 2.

In an embodiment, Formula 1 may be represented by Formula 3. Formula 3 shows the case where n is 2, and the polycyclic compound of an embodiment is a 9-membered aromatic fused ring system.

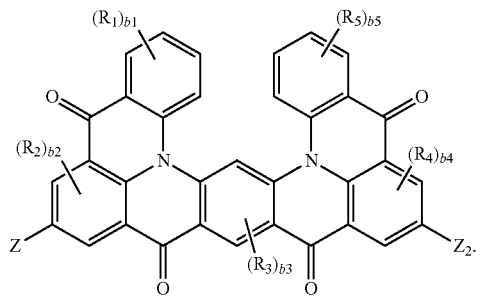

Formula 3

In Formula 3, $Z_1$ and $Z_2$ may each independently be a substituent including at least one fluorine group or at least one cyano group, or an aromatic ring group including at least one nitrogen atom as a ring-forming atom. $Z_1$ and $Z_2$ may each independently be a cyano group, a fluorine group, an alkyl group substituted with at least one fluorine group, a phenyl group substituted with at least one cyano group, at least one fluorine group or at least one trifluoromethyl group, a substituted or unsubstituted pyridine group, a substituted or unsubstituted pyrimidine group, or a substituted or unsubstituted triazine group. $Z_1$ and $Z_2$ may each be an electron withdrawing group. $Z_1$ and $Z_2$ may each independently be represented by one of Z-1 to Z-13.

In some embodiments, $Z_1$ and $Z_2$ may be the same as each other. For example, $Z_1$ and $Z_2$ may simultaneously be a cyano group, a fluorine group, or a trifluoromethyl group. For example, $Z_1$ and $Z_2$ may simultaneously be a phenyl group substituted with one or two cyano groups, a phenyl group substituted with one or two fluorine groups, or a phenyl group substituted with one or two trifluoromethyl groups. For example, $Z_1$ and $Z_2$ may simultaneously be a triazine group substituted with two phenyl groups, a pyrimidine group substituted with two phenyl groups, or a pyridine group substituted with two phenyl groups.

In some embodiments, $Z_1$ and $Z_2$ may be different from each other. For example, $Z_1$ and $Z_2$ may be a phenyl group substituted with one cyano group, and a phenyl group substituted with one fluorine group, respectively. For example, $Z_1$ and $Z_2$ may be a phenyl group substituted with two cyano groups, and a phenyl group substituted with one cyano group, respectively. For example, $Z_1$ and $Z_2$ may be a phenyl group substituted with one fluorine group, and a phenyl group substituted with two cyano groups, respectively. For example, $Z_1$ and $Z_2$ may be a phenyl group substituted with two cyano groups, and a phenyl group substituted with two fluorine groups, respectively. For example, $Z_1$ and $Z_2$ may be a phenyl group substituted with a cyano group, and a phenyl group substituted with a trifluoromethyl group, respectively. For example, $Z_1$ and $Z_2$ may be a triazine group substituted with two phenyl groups, and a phenyl group substituted with one cyano group, respectively. For example, $Z_1$ and $Z_2$ may be a pyrimidine group substituted with two phenyl groups, or a phenyl group substituted with one cyano group, respectively. For example, $Z_1$ and $Z_2$ may be a pyridine group substituted with two phenyl groups, and a phenyl group substituted with one cyano group, respectively.

In Formula 3, b4 may be 1 or 2. When b4 is 2, the two $R_4$'s may be the same as or different from each other.

b5 may be an integer of 1 to 4. When b5 is an integer of 2 or more, a plurality of $R_5$'s may all be the same as or different from each other.

$R_4$ and $R_5$ may each independently be a hydrogen atom, a deuterium atom, a halogen atom, a substituted or unsubstituted oxy group, a substituted or unsubstituted alkyl group having 1 to 20 carbon atoms, a substituted or unsubstituted aryl group having 6 to 30 ring-forming carbon atoms, or a substituted or unsubstituted heteroaryl group having 3 to 30 ring-forming carbon atoms.

For example, when b4 is 2, the two $R_4$'s may all be the same as a hydrogen atom or a deuterium atom. When b5 is 4, the four $R_5$'s may all be the same as a hydrogen atom or a deuterium atom.

In Formula 3, b1 to b3, $R_1$ to $R_3$ and Z may each independently have the same descriptions as those described in Formula 1.

In some embodiments, Formula 3 may be represented by Formula 3-1:

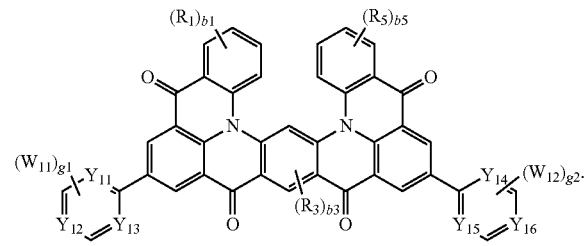

Formula 3-1

In some embodiments in Formula 3-1, $Y_{11}$ to $Y_{16}$ may each independently be a nitrogen atom or $CW_{13}$. $Y_{11}$ to $Y_{16}$ may all (e.g., simultaneously) be nitrogen atoms, or $CW_{13}$. For example, a ring group including $Y_{11}$ to $Y_{13}$ and a ring group including $Y_{14}$ to $Y_{16}$ may all (e.g., simultaneously) be a substituted or unsubstituted triazine group, or a substituted or unsubstituted phenyl group. In some embodiments, two of $Y_{11}$ to $Y_{13}$ may be nitrogen atoms, and two of $Y_{14}$ to $Y_{16}$ may be nitrogen atoms. For example, a ring group including $Y_{11}$ to $Y_{13}$ and a ring group including $Y_{14}$ to $Y_{16}$ may all (e.g., simultaneously) be a substituted or unsubstituted pyrimidine group. In some embodiments, one of $Y_{11}$ to $Y_{13}$ may be a nitrogen atom, and one of $Y_{14}$ to $Y_{16}$ may be a nitrogen atom. For example, a ring group including $Y_{11}$ to $Y_{13}$ and a ring group including $Y_{14}$ to $Y_{16}$ may all (e.g., simultaneously) be a substituted or unsubstituted pyridine group.

g1 and g2 may each independently be 1 or 2. When g1 is 2, the two $W_{11}$'s may be the same as or different from each other. When g2 is 2, the two $W_{12}$'s may be the same as or different from each other.

$W_{11}$ to $W_{13}$ may each independently be a hydrogen atom, a deuterium atom, a halogen atom, a cyano group, a substituted or unsubstituted alkyl group having 1 to 20 carbon atoms, or a substituted or unsubstituted aryl group having 6 to 30 ring-forming carbon atoms.

For example, $W_{11}$ and $W_{12}$ may each independently be a cyano group, a fluorine group, a trifluoromethyl group, or a phenyl group. When g1 is 2, the two $W_{11}$'s may each (e.g., simultaneously) be a cyano group, a fluorine group, a trifluoromethyl group, or a phenyl group. When g2 is 2, the two $W_{12}$'s may each (e.g., simultaneously) be a cyano group, a fluorine group, a trifluoromethyl group, or a phenyl group.

In some embodiments, at least one of a ring group including $Y_{11}$ to $Y_{13}$ or a ring group including $Y_{14}$ to $Y_{16}$ may be a substituted or unsubstituted phenyl group. For example, a ring group including $Y_{11}$ to $Y_{13}$ and a ring group including $Y_{14}$ to $Y_{16}$ may each (e.g., simultaneously) be a substituted or unsubstituted phenyl group. In some embodiments, one of a ring group including $Y_{11}$ to $Y_{13}$ and a ring group including $Y_{14}$ to $Y_{16}$ may be a substituted or unsubstituted phenyl group, and the other may be a nitrogen-containing ring group. For example, one of a ring group including $Y_{11}$ to $Y_{13}$ or a ring group including $Y_{14}$ to $Y_{16}$ is a substituted or unsubstituted phenyl group, and the other ring group is a substituted or unsubstituted triazine group, a substituted or unsubstituted pyrimidine group, or a substituted or unsubstituted pyridine group. When one of a ring group including $Y_{11}$ to $Y_{13}$ or a ring group including $Y_{14}$ to $Y_{16}$ is a nitrogen-containing ring group, the nitrogen-containing ring group may be substituted with a phenyl group.

For example, the ring group including $Y_{11}$ to $Y_{13}$ may be a phenyl group substituted with one cyano group, and the ring group including $Y_{14}$ to $Y_{16}$ may be a phenyl group substituted with one fluorine group. For example, the ring group including $Y_{11}$ to $Y_{13}$ may be a phenyl group substituted with one fluorine group, and the ring group including $Y_{14}$ to $Y_{16}$ may be a phenyl group substituted with two cyano groups. For example, the ring group including $Y_{11}$ to $Y_{13}$ may be a phenyl group substituted with two cyano groups, and the ring group including $Y_{14}$ to $Y_{16}$ may be a phenyl group substituted with two fluorine groups. For example, the ring group including $Y_{11}$ to $Y_{13}$ may be a phenyl group substituted with one cyano group, and the ring group including $Y_{14}$ to $Y_{16}$ may be a phenyl group substituted with one or two trifluoromethyl groups. For example, the ring group including $Y_{11}$ to $Y_{13}$ may be a triazine group substituted with two phenyl groups, a pyrimidine group substituted with two phenyl groups, or a pyridine group substituted with two phenyl groups, and the ring group including $Y_{14}$ to $Y_{16}$ may be a phenyl group substituted with one cyano group.

In Formula 3-1, b1, b3, b5, $R_1$, $R_3$, and $R_5$ may each independently have the same descriptions as those described in Formula 3

According to an embodiment, Formula 1 may be represented by Formula 1-A or Formula 1-B. "D" in Formula 1-A and Formula 1-B represents a deuterium atom.

The polycyclic compound of an embodiment may be a 5-membered fused ring system, and Formula 1-A shows the case where n is 1 in Formula 1. In Formula 1-A, b1 is 4, b2 is 2, b3 is 4, and a plurality of $R_1$ to $R_3$ are all deuterium atoms. For example, in Formula 1, when four $R_1$'s, two $R_2$'s, and four $R_3$'s are all deuterium atoms, it may be represented by Formula 1-A.

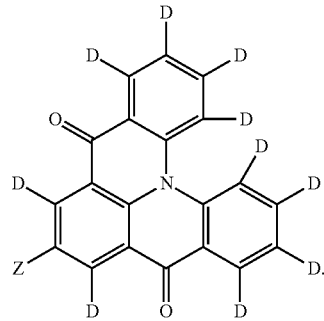

Formula 1-A

In Formula 1-A, Z may be the same as described in Formula 1.

Formula 1-B shows the case where n is 2 in Formula 1. The polycyclic compound of an embodiment is a 9-membered fused ring system having a deuterium atom as a substituent. In Formula 1-B, $Z_1$ and $Z_2$ may all (e.g., simultaneously) be electron withdrawing groups. For example, Formula 1-B may all be substituted with deuterium atoms (e.g., completely deuterated), except for Z, which is an electron withdrawing group in Formula 1.

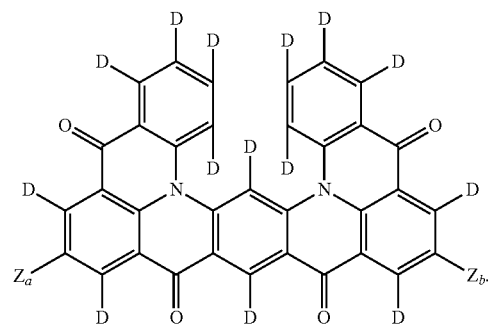

Formula 1-B $Z_a$ and $Z_b$ may each independently be a substituent including at least one fluorine group or at least one cyano group, or an aromatic ring group including at least one nitrogen atom as a ring-forming atom. In some embodiments, $Z_a$ and $Z_b$ may be the same as each other. For example, $Z_a$ and $Z_b$ may both (e.g., simultaneously) be a cyano group.

The polycyclic compound of an embodiment may be a 5- or 9-membered fused ring system including an electron withdrawing group as a substituent and having a nitrogen atom and a carbonyl group as a ring-forming atom to reduce efficiency drop. Without being bound by the correctness of any theory or explanation, it is believed that the polycyclic compound of an embodiment may decrease efficiency drop by delocalizing multiple resonances (e.g., because of increased resonance delocalization) in the 5- or 9-membered aromatic fused ring system. Accordingly, the polycyclic compound of an embodiment included in an emission layer of the organic electroluminescence device of an embodiment may contribute to improving the efficiency drop phenomenon.

The polycyclic compound of an embodiment may be any one of the compounds represented in Compound Group 1. An organic electroluminescence device 10 according to an embodiment may include at least one polycyclic compound among the polycyclic compounds represented in Compound Group 1 in an emission layer EML.

Compound Group 1

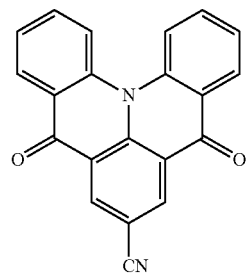

1

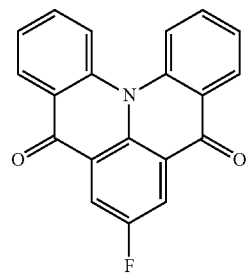

2

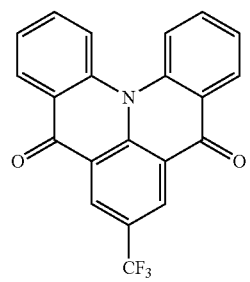

3

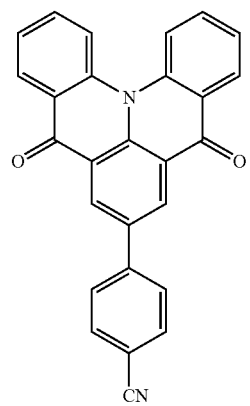

4

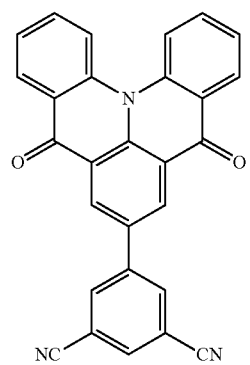

5

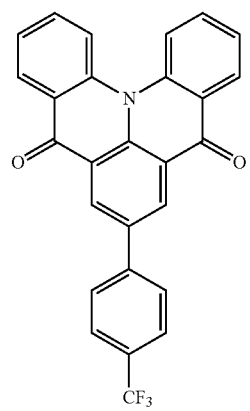

6

-continued
7
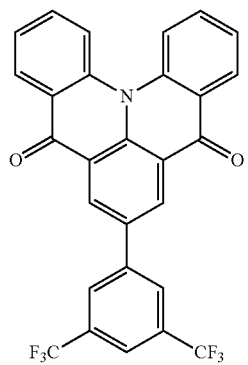
8
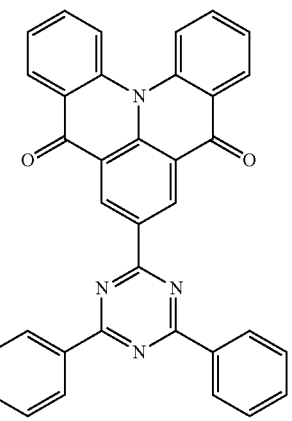
9
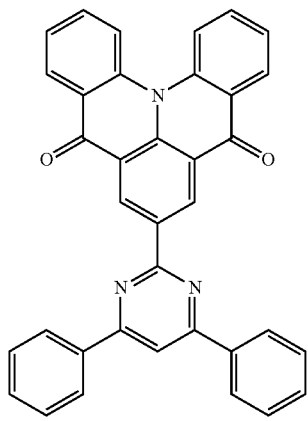
10
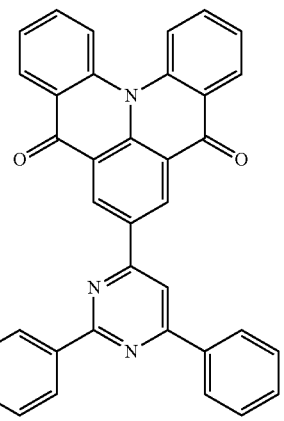
11
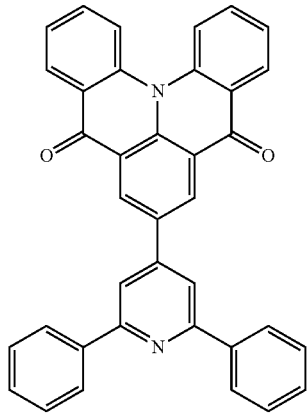
12
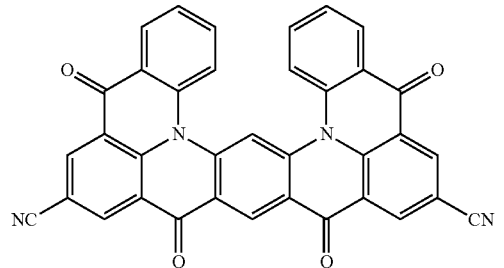
13
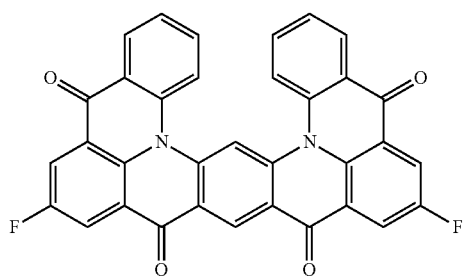
14
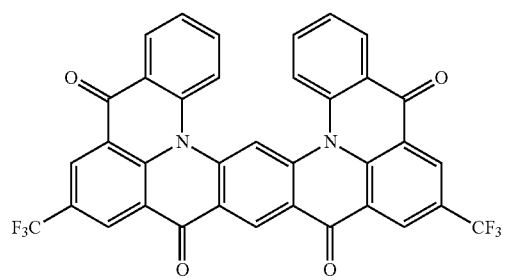

-continued
15
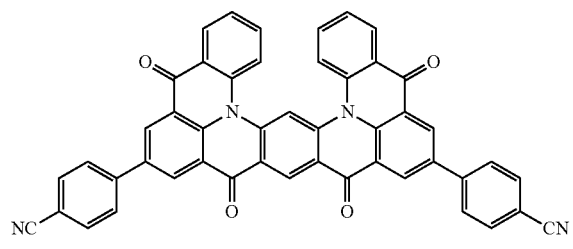
16
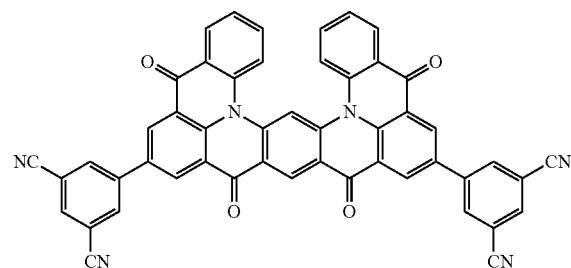
17
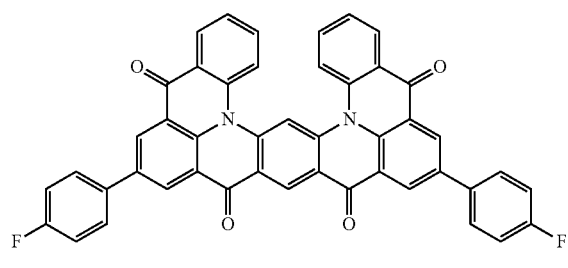
18
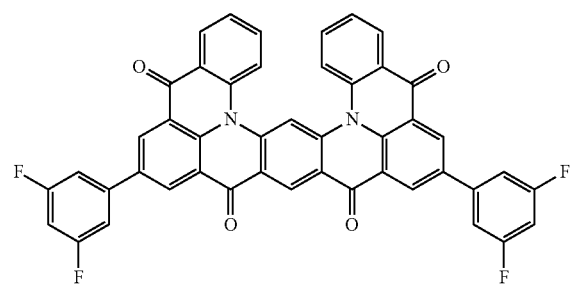
19
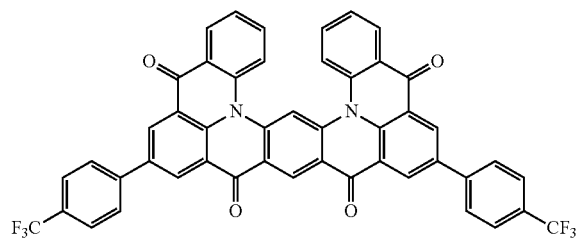
20
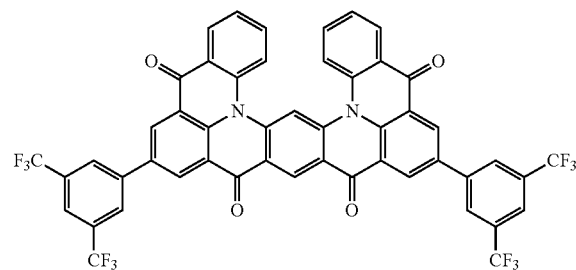
21
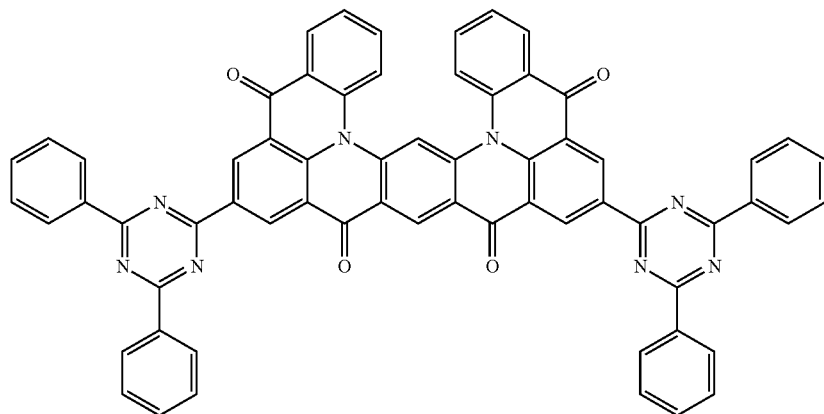

-continued
22
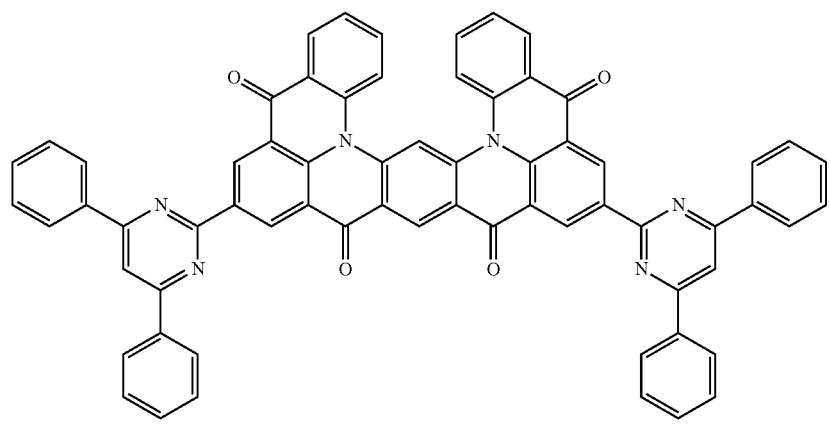
23
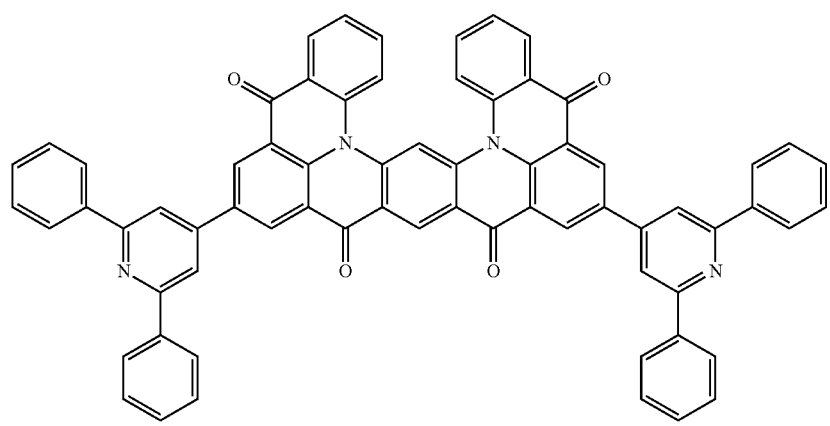
24
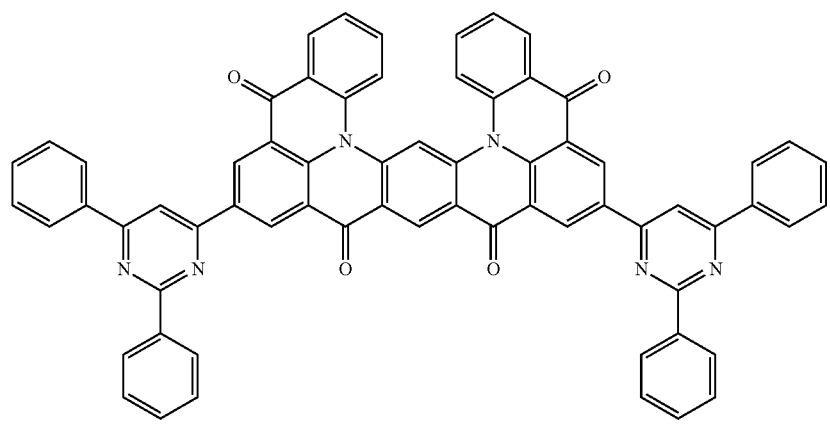
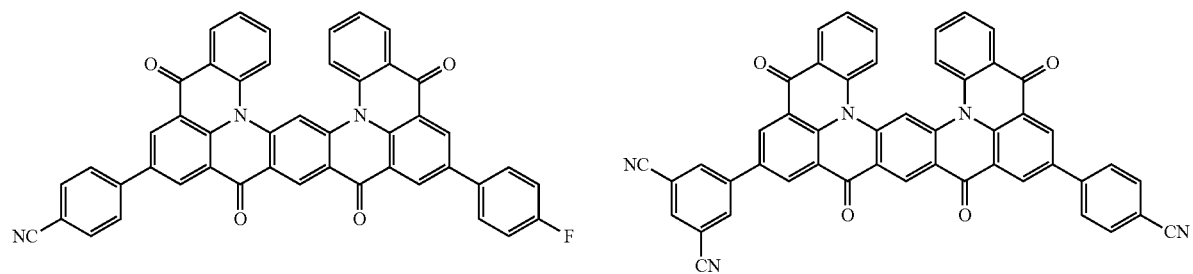
25
26

-continued
27
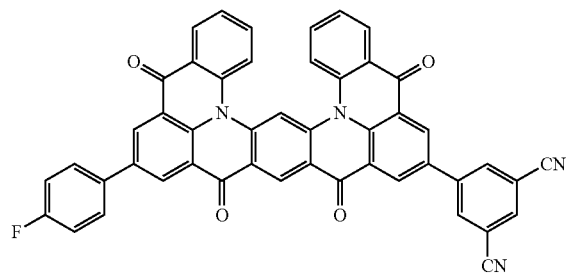
28
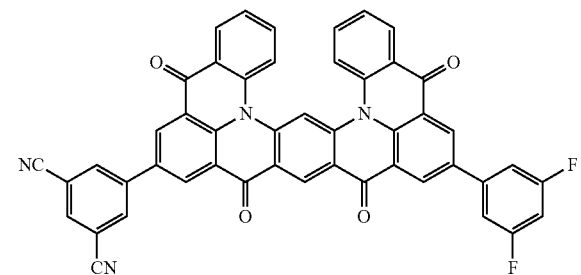
29
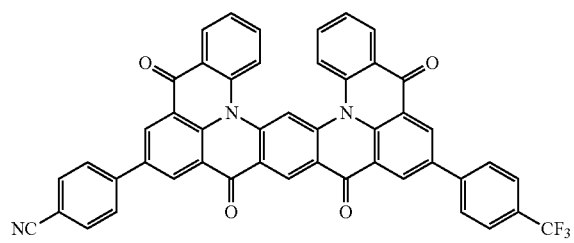
30
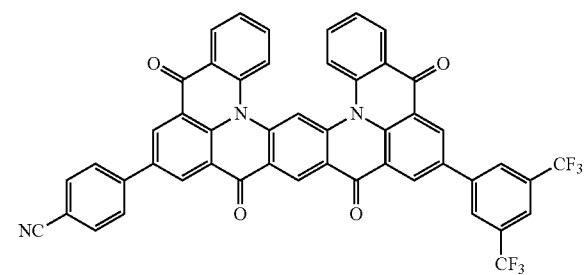
31
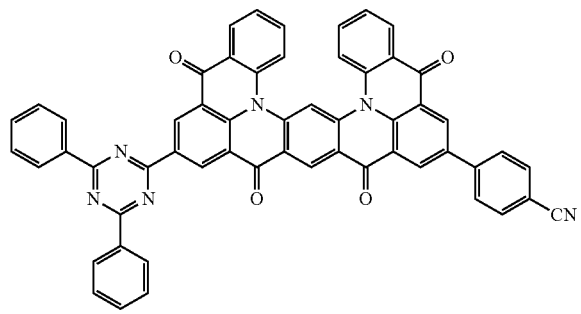
32
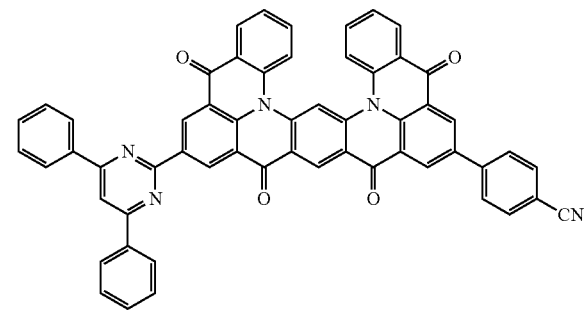
33
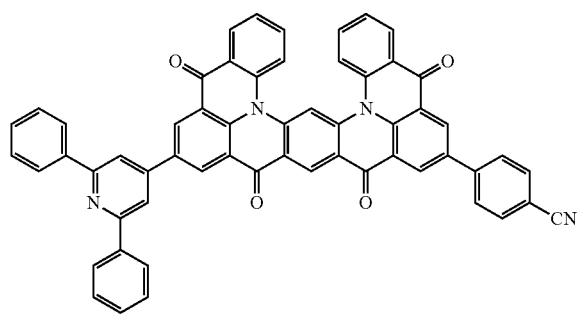
34
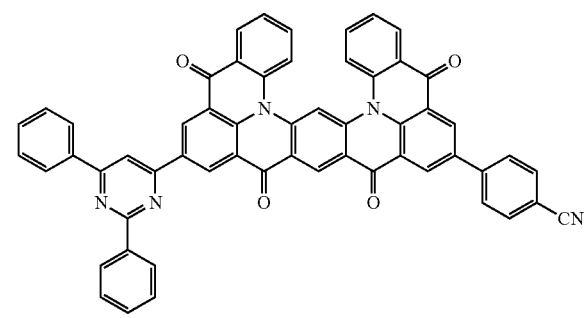

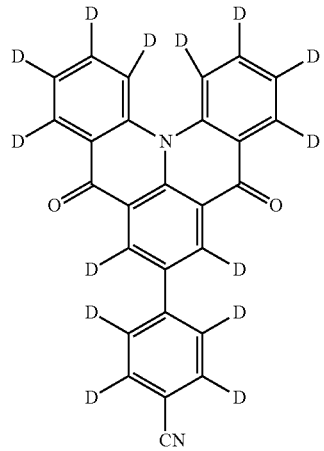

35

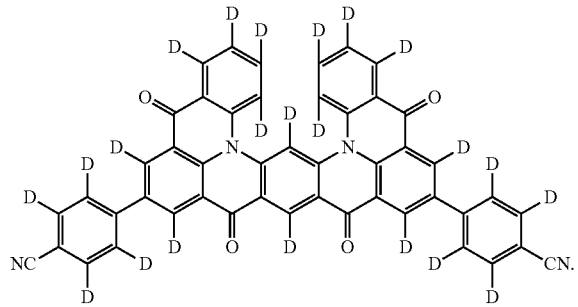

36

The polycyclic compound of an embodiment may be a thermally activated delayed fluorescence (TADF) material. The polycyclic compound of an embodiment represented by Formula 1 may be a blue thermally activated delayed fluorescence dopant.

In the organic electroluminescence device 10 of an embodiment, the emission layer EML may be to emit delayed fluorescence. For example, the emission layer EML may be to emit thermally activated delayed fluorescence (TADF).

In an embodiment, the emission layer EML may include a host and a dopant, and may include the polycyclic compound of an embodiment as a dopant. For example, in the organic electroluminescence device 10 of an embodiment, the emission layer EML may include a host for delayed fluorescence emission and a dopant for delayed fluorescence emission, and may include the polycyclic compound of an embodiment as a dopant for delayed fluorescence emission. In some embodiments, the emission layer EML may include at least one of the polycyclic compounds represented by Compound Group 1 as a thermally activated delayed fluorescence dopant.

In an embodiment, the emission layer EML may be a delayed fluorescence emission layer, and the emission layer EML may include any suitable host material and the polycyclic compound of an embodiment. For example, in an embodiment, the polycyclic compound may be used as a TADF dopant.

The emission layer EML may include any suitable host material. For example, the emission layer EML may include, as a host material, tris(8-hydroxyquinolino) aluminum (Alq3), 4,4'-bis(N-carbazolyl)-1,1'-biphenyl (CBP), poly(N-vinyl carbazole) (PVK), 9,10-di(naphthalene-2-yl)anthracene (ADN), 4,4',4"-tris (carbazol-9-yl) triphenylamine (TCTA), 1,3,5-tris(N-phenylbenzimidazole-2-yl)benzene (TPBi), 3-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), bis[2-(diphenylphosphino)phenyl]ether oxide (DPEPO), hexaphenyl cyclotriphosphazene (CP1), 1,4-bis(triphenylsilyl)benzene (UGH2), hexaphenylcyclotrisiloxane (DPSiO$_3$), octaphenylcyclotetrasiloxane (DPSiO$_4$), 2,8-bis(diphenylphosphoryl)dibenzofuran (PPF), 3,3'-bis(N-carbazolyl)-1,1'-biphenyl (mCBP), 1,3-bis(carbazolyl-9-yl)benzene (mCP), etc. However, embodiments of the present disclosure are not limited thereto, and in addition to the presented host materials, any suitable delayed fluorescence host material may be included.

In the organic electroluminescence device 10 of an embodiment, the emission layer EML may further include any suitable dopant material. In an embodiment, the emission layer EML may further include, as a dopant, styryl derivatives (e.g., 1,4-bis[2-(3-N-ethylcarbazolyl)vinyl]benzene (BCzVB), 4-(di-p-tolylamino)-4"-[(di-p-tolylamino)styryl]stilbene (DPAVB), and N-(4-((E)-2-(6-((E)-4-(diphenylamino)styryl)naphthalen-2-yl)vinyl)phenyl)-N-phenylbenzenamine (N-BDAVBi), perylene and derivatives thereof (e.g., 2,5,8,11-tetra-t-butylperylene (TBP), pyrene and derivatives thereof (e.g., 1,1-dipyrene, 1,4-dipyrenylbenzene, 1,4-bis(N,N-diphenylamino)pyrene, etc.

In some embodiments, the organic electroluminescence device 10 of an embodiment may include a plurality of emission layers. The plurality of emission layers may be sequentially stacked, and for example, the organic electroluminescence device 10 including a plurality of emission layers may be to emit white light. The organic electroluminescence device including a plurality of emission layers may be an organic electroluminescence device having a tandem structure. When the organic electroluminescence device 10 includes a plurality of emission layers, at least one emission layer EML may include the polycyclic compound of an embodiment.

In the organic electroluminescence device 10 of an embodiment illustrated in FIGS. 1 to 4, an electron transport region ETR is provided on the emission layer EML. The electron transport region ETR may include at least one of a hole blocking layer HBL, an electron transport layer ETL, and an electron injection layer EIL, but the embodiment of the present disclosure is not limited thereto.

The electron transport region ETR may have a single layer formed of a single material, a single layer formed of a plurality of different materials, or a multilayer structure including a plurality of layers formed of a plurality of different materials.

For example, the electron transport region ETR may have a single layer structure of an electron injection layer EIL or an electron transport layer ETL, or may have a single layer structure formed of an electron injection material and an electron transport material. In some embodiments, the electron transport region ETR may have a single layer structure formed of a plurality of different materials, or may have a structure in which an electron transport layer ETL/electron injection layer EIL and a hole blocking layer HBL/electron transport layer ETL/electron injection layer EIL are stacked in order from the emission layer EML, but is not limited thereto. The thickness of the electron transport region ETR may be, for example, about 300 Å to about 1,500 Å.

The electron transport region ETR may be formed using any suitable method (such as a vacuum deposition method, a spin coating method, a cast method, a Langmuir-Blodgett (LB) method, an inkjet printing method, a laser printing method, a laser induced thermal imaging (LITI) method, etc.)

When the electron transport region ETR includes the electron transport layer ETL, the electron transport region ETR may include an anthracene-based compound. However, embodiments of the present disclosure are not limited thereto, and the electron transport region may include, for example, tris(8-hydroxyquinolinato) aluminum (Alq3), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzimidazolyl-1-ylphenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato) aluminum (BAlq), beryllium bis(benzoquinolin-10-olate (Bebq2), 9,10-di(naphthalene-2-yl) anthracene (ADN), 1,3-bis[3,5-di(pyridin-3-yl)phenyl] benzene (BmPyPhB) or a mixture thereof. The thickness of the electron transport layer ETL may be about 100 Å to about 1,000 Å and may be, for example, about 150 Å to about 500 Å. When the thickness of the electron transport layer ETL satisfies the above-described range, satisfactory electron transport properties may be obtained without a substantial increase in driving voltage.

When the electron transport region ETR includes the electron injection layer EIL, the electron transport region ETR may be a halogenated metal (such as LiF, NaCl, CsF, RbCl, and/or RbI), a lanthanide metal (such as Yb), a metal oxide (such as Li₂O and/or BaO), or lithium quinolate (LiQ), but is not limited thereto. In some embodiments, the electron injection layer EIL may be formed of a mixture of an electron transport material and an insulating organo-metal salt. The organo-metal salt may be a material having an energy band gap of about 4 eV or more. The organo-metal salt may include, for example, metal acetates, metal benzoates, metal acetoacetates, metal acetylacetonates, and/or metal stearates. The thickness of the electron injection layers EIL may be about 1 Å to about 100 Å, and about 3 Å to about 90 Å. When the thickness of the electron injection layers EIL satisfies the above-described range, satisfactory electron injection properties may be obtained without a substantial increase in driving voltage.

As described above, the electron transport region ETR may include a hole blocking layer HBL. The hole blocking layer HBL may include, for example, at least one of 2,9-dimethyl-4,7-diphenyl-1,10-phenanthroline (BCP) or 4,7-diphenyl-1,10-phenanthroline (Bphen), but is not limited thereto.

The second electrode EL2 is provided on the electron transport region ETR. The second electrode EL2 may be a common electrode or a cathode. The second electrode EL2 may be a transmissive electrode, a transflective electrode, or a reflective electrode. When the second electrode EL2 is a transmissive electrode, the second electrode EL2 may include a transparent metal oxide, for example, indium tin oxide (ITO), indium zinc oxide (IZO), zinc oxide (ZnO), and/or indium tin zinc oxide (ITZO).

When the second electrode EL2 is a transflective electrode or a reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, In, Zn, Sn, Yb, a compound thereof, or a mixture thereof (e.g., a mixture of Ag and Mg). In some embodiments, the second electrode EL2 may have a multi-layer structure including a reflective film or a transflective film formed of the above-described materials, and a transparent conductive film formed of indium tin oxide (ITO), indium zinc oxide (IZO), zinc oxide (ZnO), indium tin zinc oxide (ITZO), etc.

In some embodiments, the second electrode EL2 may be connected with an auxiliary electrode. When the second electrode EL2 is connected with the auxiliary electrode, the resistance of the second electrode EL2 may decrease.

In some embodiments, a capping layer CPL may be further disposed on the second electrode EL2 of the organic electroluminescence device 10 of an embodiment. The capping layer CPL may include, for example, α-NPD, NPB, TPD, m-MTDATA, Alq3, CuPc, N4,N4,N4',N4'-tetra(biphenyl-4-yl) biphenyl-4,4'-diamine (TPD15), 4,4',4"-tris(carbazol-9-yl)triphenylamine (TCTA), N,N'-bis(naphthalen-1-yl), etc. However, embodiments are not limited thereto, and the capping layer CPL may include an amine compound. For example, the capping layer CPL may include at least one of the compounds CPL1 or CPL2:

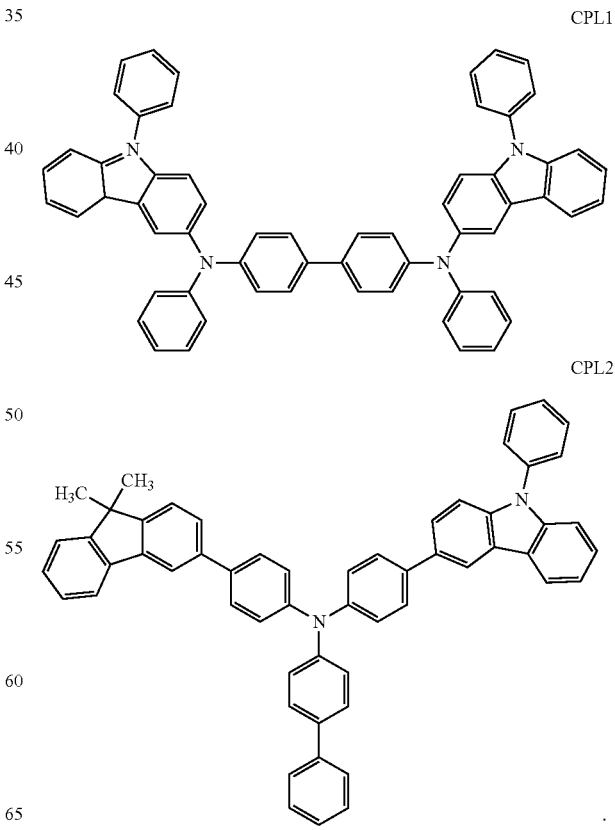

In some embodiments, the capping layer CPL may have a refractive index of about 1.6 or more. For example, for light in a wavelength range of about 550 nm to about 600 nm, the capping layer CPL may have a refractive index of about 1.6 or more.

Hereinafter, with reference to Examples and Comparative Examples, a compound according to an embodiment of the present disclosure and an organic electroluminescence device of an embodiment will be described in more detail. The Examples are illustrated only for understanding, and the scope of the present disclosure is not limited thereto

EXAMPLES

1. Synthesis of Polycyclic Compound of Example

First, a process of synthesizing a polycyclic compound according to this embodiment will be described in more detail with respect to Compounds 1, 15, and 21 as examples. The processes of synthesizing a polycyclic compound are provided as examples, and a process of synthesizing a compound according to an embodiment of the present disclosure is not limited to the Examples.

(1) Synthesis of Compound 1

Compound 1 according to Example may be synthesized by, for example, Reaction Formulae 1-1 to 1-4.

Synthesis of Intermediate Compound A

Intermediate Compound A was synthesized by Reaction Formula 1-1

Reaction Formula 1-1

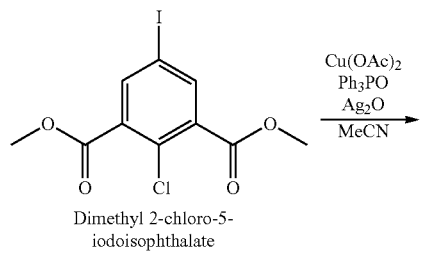

Dimethyl 2-chloro-5-iodoisophthalate

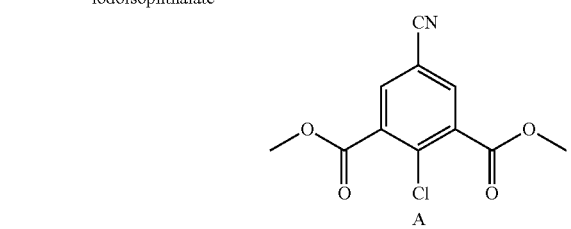

A

Dimethyl 2-chloro-5-iodoisophthalate (30 g, 85 mmol), Cu(OAc)$_2$ (0.31 g, 1.7 mmol), Ph$_3$PO (0.95 g, 3.4 mmol), and Ag$_2$O (19.7 g, 85 mmol) were added to DMF (280 mL), and the mixture was heated and stirred at 130° C. for 15 hours. Water was added, filtration was performed through diatomaceous earth (Celite) for liquid separation, and an organic layer was concentrated. Purification by silica gel column chromatography was performed to obtain Compound A (20.3 g, yield 94%).

Synthesis of Intermediate Compound B

Intermediate Compound B was synthesized by Reaction Formula 1-2:

Reaction Formula 1-2

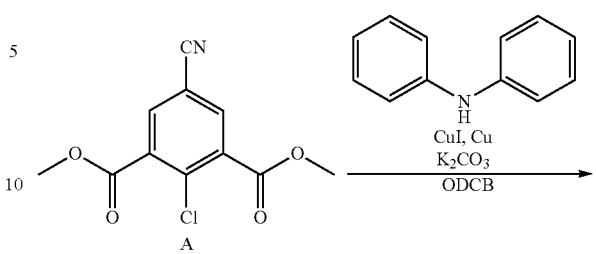

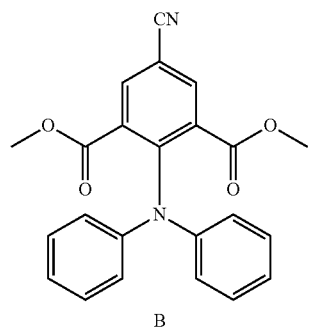

B

Compound A (20 g, 80 mmol), diphenylamine (15 g, 88 mmol), Cu (1.5 g, 24 mmol), CuI (0.76 g, 4 mmol), and K$_2$CO$_3$ (0.77 g, 12 mmol) were added to orthodichlorobenzene (ODCB, 320 mL), and the mixture was heated and stirred at 160° C. for 8 hours. Water was added, filtration was performed through diatomaceous earth (Celite) for liquid separation, and an organic layer was concentrated. Purification by silica gel column chromatography was performed to obtain Compound B (27 g, yield 87%).

Synthesis of Intermediate Compound C

Intermediate Compound C was synthesized by Reaction Formula 1-3:

Reaction Formula 1-3

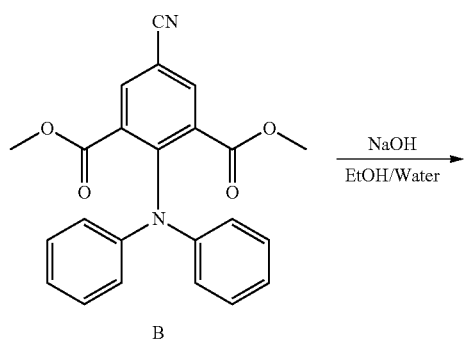

B

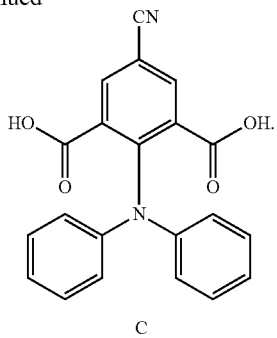

C

Compound B (25 g, 65 mmol) and NaOH (5.2 g, 130 mmol) were added to ethanol (EtOH, 300 mL) and pure water (300 mL), and stirred at room temperature for 2 hours. Toluene was added to perform liquid separation, and an organic layer was concentrated to obtain Compound C (22 g, yield 95%).

Synthesis of Compound 1

Compound 1 was synthesized by Reaction Formula 1-4:

Reaction Formula 1-4

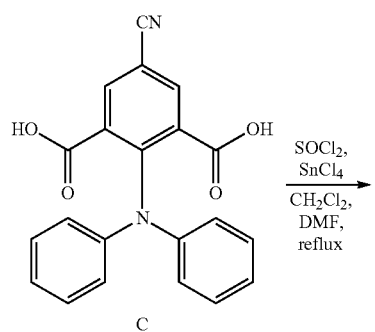

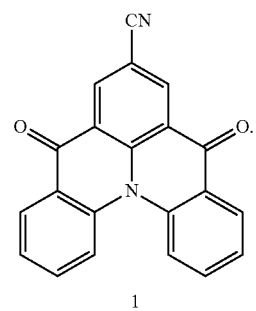

1

Compound C (2.9 g, 8.0 mmol), SOCl$_2$ (4.3 g, 8.4 mmol), and DMF (0.80 mL) were added to CHCl$_2$ (80 mL) and heated to reflux for 3 hours. Thereafter, tin (IV) chloride (16.2 mL, 8.4 mmol) was added, and further heated to reflux for 3 hours. After lowering the temperature to room temperature, the resultant was added dropwise to 1M of NaOH to perform liquid separation, and an organic layer was concentrated. Purification by silica gel column chromatography was performed to obtain Compound 1 (2.20 g, yield 85%).

(1) Synthesis of Compound 15

Compound 15 according to Example may be synthesized by, for example, Reaction Formulas 2-1 to 2-4:

Synthesis of Intermediate Compound D

Intermediate Compound D was synthesized by Reaction Formula 2-1:

Reaction Formula 2-1

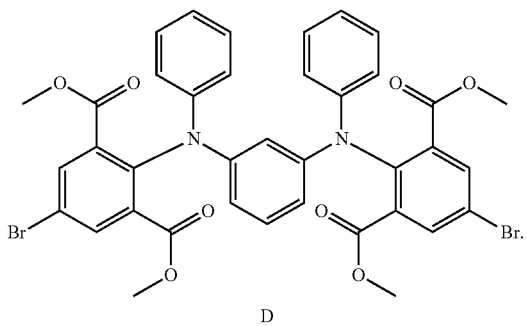

D

Dimethyl 5-bromo-2-iodoisophthalate (15 g, 38 mmol), N1,N3-diphenylbenzene-1,3-diamine (4.9 g, 19 mmol), Cu (0.15 g, 0.16 mmol), CuI (0.19 g, 0.64 mmol), and K$_2$CO$_3$ (5.3 g, 38 mmol) were added to ODCB (320 mL), and the mixture was heated and stirred at 80° C. for 2 hours. Water was added, filtration was performed through diatomaceous earth (Celite) for liquid separation, and an organic layer was concentrated. Purification by silica gel column chromatography was performed to obtain Compound D (11 g, yield 75%).

Synthesis of Intermediate Compound E

Intermediate Compound E was synthesized by Reaction Formula 2-2:

Reaction Formula 2-2

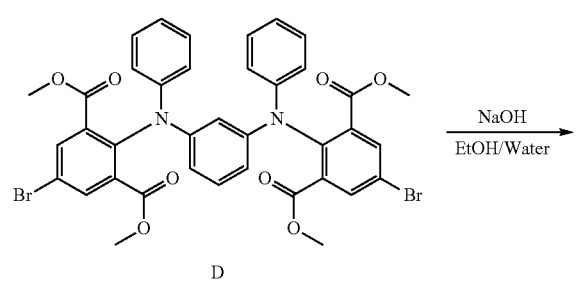

D

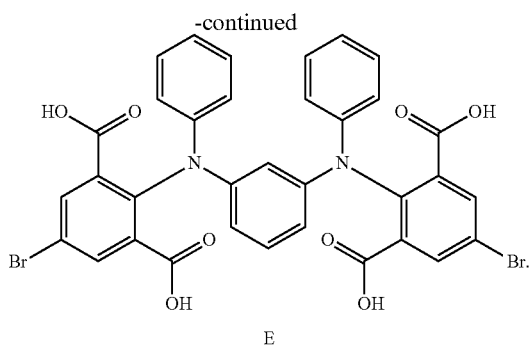

E

Compound D (11 g, 14 mmol) and NaOH (2.3 g, 56 mmol) were added to 150 mL of ethanol and 150 mL of pure water, and heated and stirred at room temperature for 2 hours. Toluene was added to perform liquid separation, and an organic layer was concentrated to obtain Compound E (9.9 g, yield 95%).

Synthesis of Intermediate Compound F

Intermediate Compound F was synthesized by Reaction Formula 2-3:

Reaction Formula 2-3

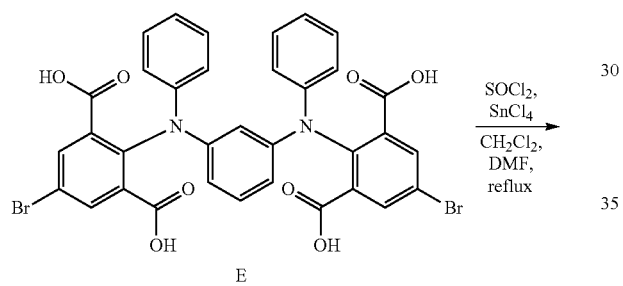

E

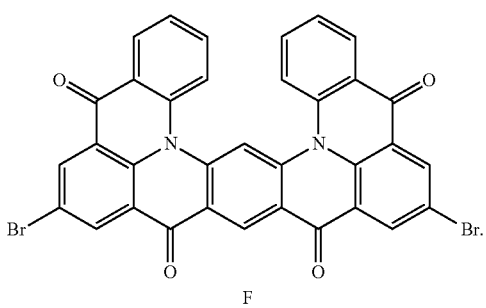

F

Compound E (6.0 g, 8.04 mmol), SOCl$_2$ (4.26 g, 8.44 mmol), and DMF (0.8 mL) were added to CHCl$_2$ (80 mL) and heated to reflux for 3 hours. Thereafter, tin (IV) chloride (16.2 mL, 8.44 mmol) was added, and further heated to reflux for 3 hours. After lowering the temperature to room temperature, the resultant was added dropwise to 1M of NaOH to perform liquid separation, and an organic layer was concentrated. Purification by silica gel column chromatography was performed to obtain Compound F (4.06 g, yield 75%).

Synthesis of Compound 15

Compound 15 was synthesized by Reaction Formula 2-4:

Reaction Formula 2-4

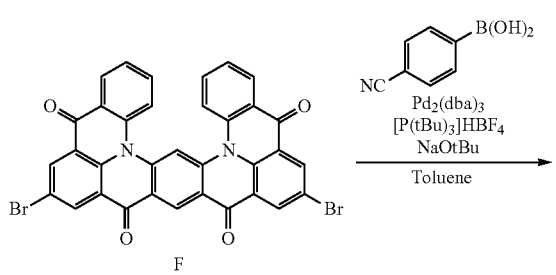

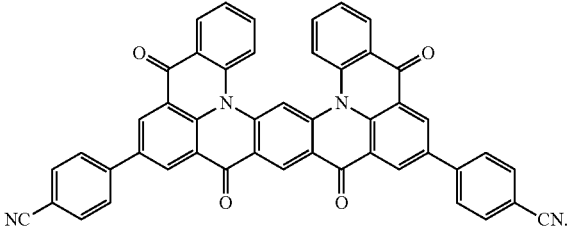

15

Compound F (9.8 g, 15 mmol), 4-bromobenzonitrile (4.7 g, 32 mmol), bis (dibenzylidene acetone)palladium (0) (Pd (dba)$_2$, 0.27 g, 0.29 mmol), tri-tert-butyl phosphonium tetrafluoro borate (P(tBu)$_3$HBF$_4$), 0.34 g, 1.2 mmol), and sodium tert-butoxide (NaOtBu, 2.1 g, 22 mmol) were added to toluene (200 mL), and the mixture was heated and stirred at 80° C. for 2 hours. Water was added, filtration was performed through diatomaceous earth (Celite) for liquid separation, and an organic layer was concentrated. Purification by silica gel column chromatography was performed to obtain Compound 15 (7.3 g, yield 70%).

(2) Synthesis of Compound 21

Compound 21 according to Example may be synthesized by, for example, Reaction Formula 3:

Reaction Formula 3

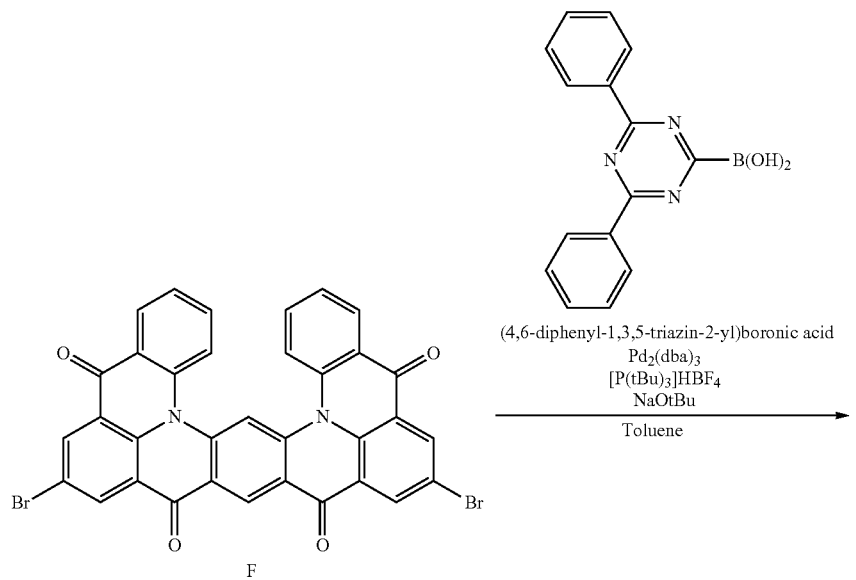

(4,6-diphenyl-1,3,5-triazin-2-yl)boronic acid
Pd$_2$(dba)$_3$
[P(tBu)$_3$]HBF$_4$
NaOtBu
Toluene

F

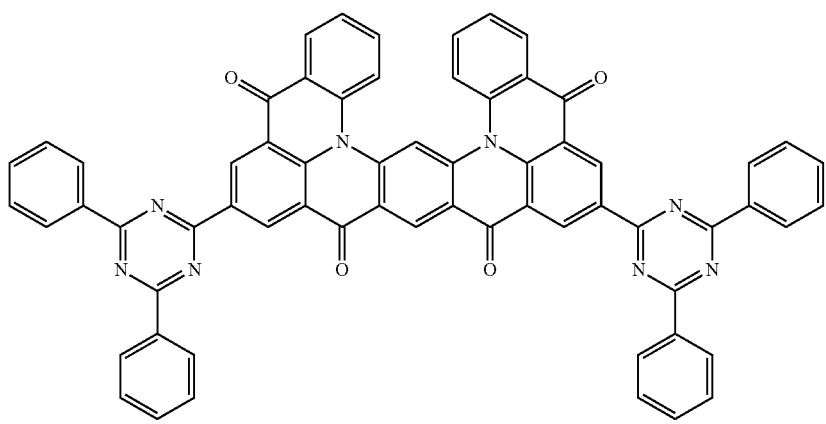

21

Compound F (9.8 g, 15 mmol), (4,6-diphenyl-1,3,5-triazin-2-yl) boronic acid (8.8 g, 32 mmol), bis (dibenzylidene acetone) palladium (0) (Pd(dba)$_2$, 0.27 g, 0.29 mmol), tri-tert-butyl phosphonium tetrafluoro borate (P(tBu)$_3$ HBF$_4$), 0.34 g, 1.16 mmol), and sodium tert-butoxide (NaOtBu, 2.1 g, 22 mmol) were added to toluene (200 mL), and the mixture was heated and stirred at 80° C. for 2 hours. Water was added, filtration was performed through diatomaceous earth (Celite) for liquid separation, and an organic layer was concentrated. Purification by silica gel column chromatography was performed to obtain Compound 21 (10 g, yield 69%).

2. Evaluation of Polycyclic Compounds and Manufacture and Evaluation of Organic Electroluminescence Devices The luminous characteristics of a polycyclic compound of an embodiment and organic electroluminescence devices of an embodiment including a polycyclic compound of an embodiment in an emission layer were evaluated as follows. A method of manufacturing an organic electroluminescence device for evaluation is described below.

The organic electroluminescence devices of Examples 1 to 3 were manufactured using Compounds 1, 15, and 21, respectively, as a dopant material for an emission layer. Comparative Examples 1 and 2 are organic electroluminescence devices manufactured using Comparative Example Compounds X-1 and X-2, respectively, as a dopant material for an emission layer.

The compounds used in Examples 1 to 3 and Comparative Examples 1 and 2 are shown in Table 1:

TABLE 1
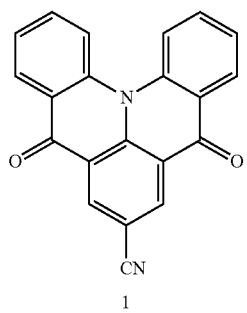 [SMILES: N#Cc1cc2c(=O)c3ccccc3n3c4ccccc4c(=O)c(c1)c23]
1
Compound 1
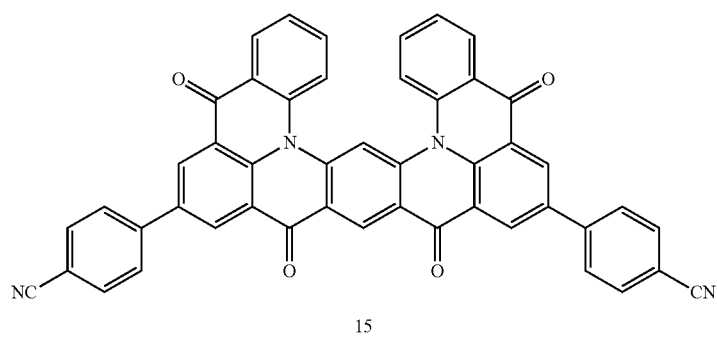 [SMILES: N#Cc1ccc(-c2cc3c(=O)c4ccccc4n4c5cc6c(cc5c(=O)c(c2)c34)c(=O)c2cc(-c3ccc(C#N)cc3)cc3c(=O)c4ccccc4n6c32)cc1]
15
Compound 15
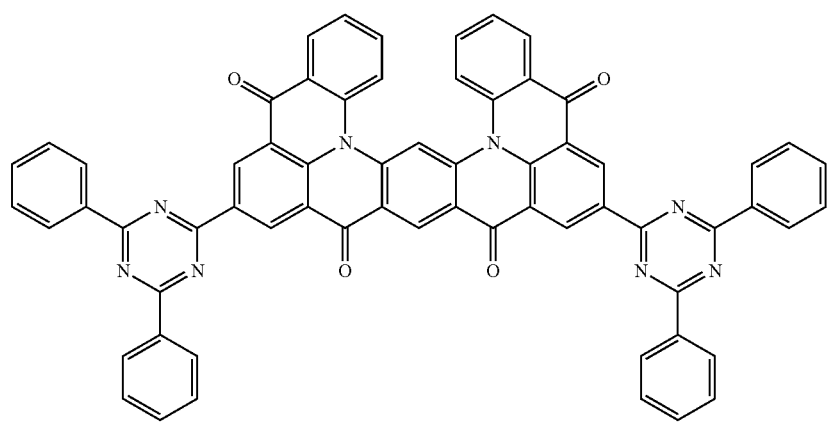
21
Compound 21
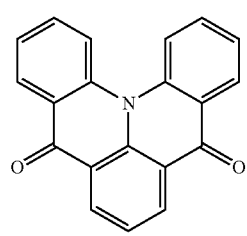 [SMILES: O=c1c2ccccc2n2c3ccccc3c(=O)c3cccc1c32]
Comparative Compound X-1

TABLE 1-continued

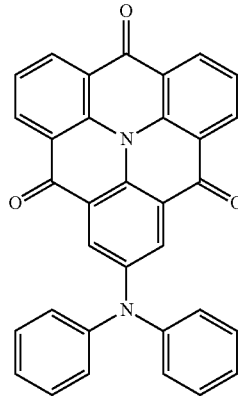

Comparative Compound X-2

Evaluation of Luminous Properties of Compounds

A 5.0 mM toluene solution was prepared of each of the Examples and Comparative Examples, and the luminous properties of each were evaluated using a JASCO V-670 spectrometer. Luminous spectra were measured at room temperature and 77K. In addition, the photoluminescent quantum yield (PLQY) of the 5.0 mM toluene solution was measured using HAMAMATSU Quantaurus-QY. Table 2 shows the maximum emission wavelength (λmax) in the emission spectrum measured at room temperature and full width at half maximum (FWHM) in the emission spectrum.

TABLE 2

| Item | $\lambda_{max}$ (nm) | FWHM (nm) | PLQY (%) |
|---|---|---|---|
| Compound 1 | 460 | 35 | 89 |
| Compound 15 | 467 | 27 | 91 |
| Compound 21 | 465 | 20 | 88 |
| Comparative Compound X-1 | 464 | 37 | 89 |
| Comparative Compound X-2 | 440 | 45 | 30 |

Referring to Table 2, it can be seen that Compounds 1, 15, and 21, which are polycyclic compounds of an embodiment, each have a maximum emission wavelength of about 470 nm or less and emit deep blue light therefrom. The full width at half maximum (FWHM) in the emission spectra of Compounds 1, 15, and 21, which are polycyclic compounds of an embodiment, are confirmed to be narrow to about 35 nm or less. In addition, Compounds 1, 15, and 21 of Examples each have a large value of quantum efficiency (PLQY) compared to Comparative Example Compound X-2, and thus it can be seen that the luminous efficiency is excellent.

Comparative Example Compounds X-1 and X-2 each have a maximum emission wavelength of about 470 nm or less, and thus it can be seen that deep blue light is emitted therefrom. However, it can be seen that Comparative Example Compounds X-1 and X-2 each have a full width at half maximum of about 37 nm or more, and the Comparative Example Compounds have a greater full width at half maximum than Example Compounds. For example, it can be seen that Comparative Example Compounds emit light having a lower color purity than Example Compounds. In addition, it can be seen that Comparative Example Compound X-2 has lower quantum efficiency (PLQY) than Example Compounds.

The polycyclic compounds of an embodiment include at least one electron withdrawing group as a substituent, thereby improving the efficiency drop phenomenon and emitting deep blue light having high color purity when compared to the Comparative Example Compounds.

Manufacture of Organic Electroluminescence Devices

On a glass substrate, ITO was patterned to a thickness of about 1500 Å, washed with ultra-pure water, cleaned with ultrasonic waves, irradiated with UV for 30 minutes, and then ozone-treated. Thereafter, HAT-CN was deposited to a thickness of 100 Å, α-NPD was deposited to a thickness of 800 Å, and mCP was deposited to a thickness of 50 Å to form a hole transport region.

Next, in the forming of each emission layer, polycyclic compounds of an embodiment or Comparative Example Compounds and mCBP were co-deposited at 1:99 to form a layer having a thickness of 200 Å. For example, the emission layers formed by co-deposition in Examples 1 and 2 were deposited by mixing Compounds 1 and 15, respectively, with mCBP, and in Comparative Examples 1 and 2, Comparative Example Compounds X-1 and X-2, respectively, were mixed with mCBP and deposited.

Thereafter, on the emission layers, a layer having a thickness of 300 Å was formed of TPBi and a layer having a thickness of 50 Å was formed of LiQ to form an electron transport region. Then, a second electrode having a thickness of 1000 Å was formed of aluminum (Al). A capping layer having a thickness of 700 Å was formed of CPL1 on the second electrode.

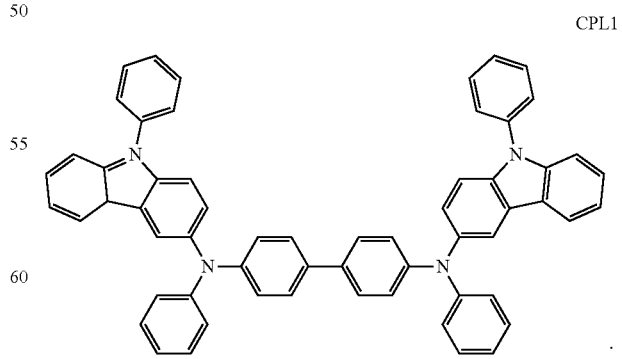

CPL1

In an embodiment, the hole transport region, the emission layer, the electron transport region, and the second electrode were formed using a vacuum deposition apparatus.

Evaluation of Organic Electroluminescence Device Characteristics

Table 3 shows the evaluation results of the organic electroluminescence devices of Examples 1 to 3 and Comparative Examples 1 and 2. Table 3 shows maximum emission wavelength (λmax), external quantum efficiency ($EQE_{max}$, 1000 nit) of the manufactured organic electroluminescence devices by comparison. In the characteristic evaluation results of Examples and Comparative Examples shown in Table 3, the maximum emission wavelength (λmax) refers to the wavelength representing the maximum value in the emission spectrum, the external quantum efficiency ($EQE_{max}$, 1000 nit) refers to a luminance of 1000 cd/m².

TABLE 3

| Item | Dopant material | $\lambda_{max}$ (nm) | $EQE_{max}$, 1000 nit (%) |
|---|---|---|---|
| Example 1 | Compound 1 | 460 | 8.2 |
| Example 2 | Compound 15 | 465 | 19.8 |
| Example 3 | Compound 21 | 463 | 17.5 |
| Comparative Example 1 | Comparative Compound X-1 | 466 | 5.3 |
| Comparative Example 2 | Comparative Compound X-2 | 450 | 3.2 |

Referring to the results of Table 3, it can be seen that the organic electroluminescence devices of Examples 1 to 3 emit deep blue light having a short wavelength, and exhibit high efficiency characteristics compared to the organic electroluminescence devices of Comparative Examples 1 and 2. In the case of Example Compounds, reverse intersystem crossing (RISC) is more easily generated when compared to Comparative Example Compound X-1, and thus the organic electroluminescence devices of Examples 1 to 3 including the polycyclic compound of an embodiment have high external quantum efficiency.

The organic electroluminescence device of Comparative Example 2 emits short wavelength light, but has a low external quantum efficiency.

The Example Compounds each include a phenyl group substituted with at least one cyano group as an electron withdrawing group, and thus multiple resonances (e.g., resonance structures) may be delocalized in a polycyclic aromatic ring system. Because the multiple resonances are delocalized on the Example Compounds, it is seen that the organic electroluminescence device of Example 2 has improved efficiency drop at high luminance, compared to the organic electroluminescence device of Comparative Example 1.

The polycyclic compound of an embodiment includes an electron withdrawing group as a substituent in a 5- or 9-ring aromatic fused ring system containing a nitrogen atom and a carbonyl group as a ring-forming atom, and thus multiple resonances are delocalized, and the efficiency drop is improved at high luminance. The polycyclic compound of an embodiment may be included in an emission emitting layer of the organic electroluminescence device of an embodiment, thereby contributing to improving the efficiency drop at high luminance.

An organic electroluminescence device of an embodiment may exhibit improved device characteristics of high efficiency in a blue wavelength range.

A polycyclic compound of an embodiment may be included in an emission layer of an organic electroluminescence device to contribute to making the organic electroluminescence device have high efficiency.

As used herein, the terms "substantially," "about," and similar terms are used as terms of approximation and not as terms of degree, and are intended to account for the inherent deviations in measured or calculated values that would be recognized by those of ordinary skill in the art.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Although the present disclosure has been described with reference to example embodiments of the present disclosure, it will be understood that the present disclosure should not be limited to these embodiments, but that various changes and modifications can be made by those skilled in the art without departing from the spirit and scope of the present disclosure.

Accordingly, the technical scope of the present disclosure is not intended to be limited to the contents set forth in the detailed description of the specification, but is intended to be defined by the appended claims and equivalents thereof.

What is claimed is:

1. An organic electroluminescence device comprising:
a first electrode;
a second electrode on the first electrode; and
an emission layer between the first electrode and the second electrode, and comprising a polycyclic compound represented by Formula 1,
wherein the first electrode and the second electrode each independently comprise one selected from Ag, Mg, Cu, Al, Pt, Pd, Au, Ni, Nd, Ir, Cr, Li, Ca, LiF/Ca, LiF/Al, Mo, Ti, In, Zn, Sn, and Yb, a compound of two or more thereof, a mixture of two or more thereof, and an oxide thereof:

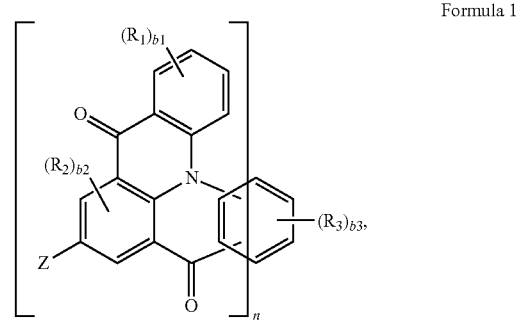

Formula 1 and
wherein in Formula 1,
n is 1 or 2,

Z is a substituent containing at least one fluorine group or at least one cyano group, or an aromatic ring group containing at least one nitrogen atom as a ring-forming atom, b1 and b3 are each independently an integer of 1 to 4, b2 is 1 or 2, and $R_1$ to $R_3$ are each independently a hydrogen atom, a deuterium atom, a halogen atom, a substituted or unsubstituted oxy group, a substituted or unsubstituted alkyl group having 1 to 20 carbon atoms, a substituted or unsubstituted aryl group having 6 to 30 ring-forming carbon atoms, or a substituted or unsubstituted heteroaryl group having 3 to 30 ring-forming carbon atoms.

2. The organic electroluminescence device of claim 1, wherein Z is a cyano group, a fluorine group, an alkyl group substituted with at least one fluorine group, a phenyl group substituted with at least one cyano group or at least one trifluoromethyl group, a substituted or unsubstituted pyridine group, a substituted or unsubstituted pyrimidine group, or a substituted or unsubstituted triazine group.

3. The organic electroluminescence device of claim 1, wherein Formula 1 is represented by Formula 2 or Formula 3:

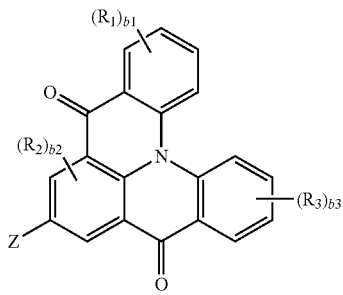

Formula 2

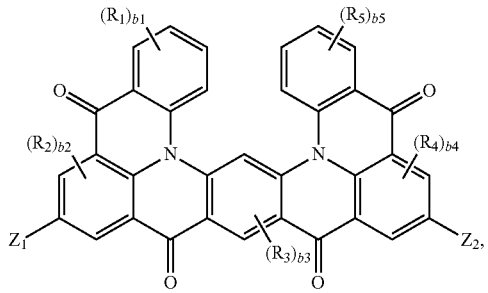

Formula 3 and wherein in Formula 3, $Z_1$ and $Z_2$ are each independently a substituent containing at least one fluorine group or at least one cyano group, or an aromatic ring group containing at least one nitrogen atom as a ring-forming atom, b4 is 1 or 2, b5 is an integer of 1 to 4, $R_4$ and $R_5$ are each independently a hydrogen atom, a deuterium atom, a halogen atom, a substituted or unsubstituted oxy group, a substituted or unsubstituted alkyl group having 1 to 20 carbon atoms, a substituted or unsubstituted aryl group having 6 to 30 ring-forming carbon atoms, or a substituted or unsubstituted heteroaryl group having 3 to 30 ring-forming carbon atoms, and in Formulae 2 and 3, b1 to b3, $R_1$ to $R_3$, and Z are each independently the same as defined in Formula 1.

4. The organic electroluminescence device of claim 3, wherein Formula 2 is represented by Formula 2-1:

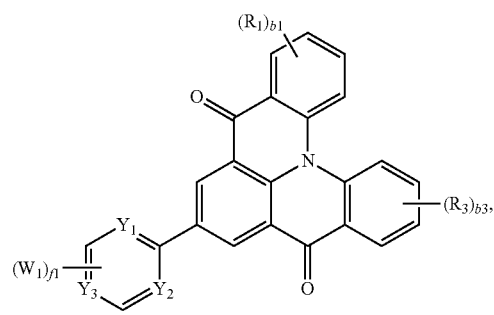

Formula 2-1 and wherein in Formula 2-1, f1 is 1 or 2, $Y_1$ to $Y_3$ are each independently a nitrogen atom or $CW_2$, $W_1$ and $W_2$ are each independently a hydrogen atom, a deuterium atom, a halogen atom, a cyano group, a substituted or unsubstituted alkyl group having 1 to 20 carbon atoms, or a substituted or unsubstituted aryl group having 6 to 30 ring-forming carbon atoms, and b1, b3, $R_1$ and $R_3$ are each independently the same as defined in Formula 2.

5. The organic electroluminescence device of claim 3, wherein Formula 3 is represented by Formula 3-1:

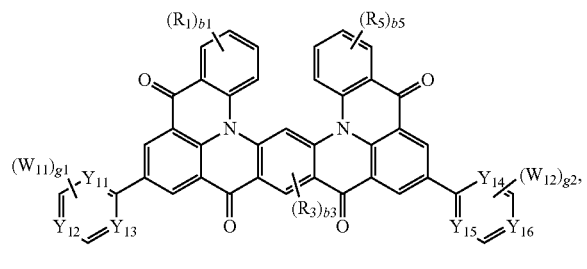

Formula 3-1 and wherein in Formula 3-1, $Y_{11}$ to $Y_{16}$ are each independently a nitrogen atom or $CW_{13}$, g1 and g2 are each independently 1 or 2, $W_{11}$ to $W_{13}$ are each independently a hydrogen atom, a deuterium atom, a halogen atom, a cyano group, a substituted or unsubstituted alkyl group having 1 to 20 carbon atoms, or a substituted or unsubstituted aryl group having 6 to 30 ring-forming carbon atoms, and b1, b3, b5, $R_1$, $R_3$, and $R_5$ are each independently the same as defined in Formula 3.

6. The organic electroluminescence device of claim 1, wherein Z is represented by any one of Z-1 to Z-13:

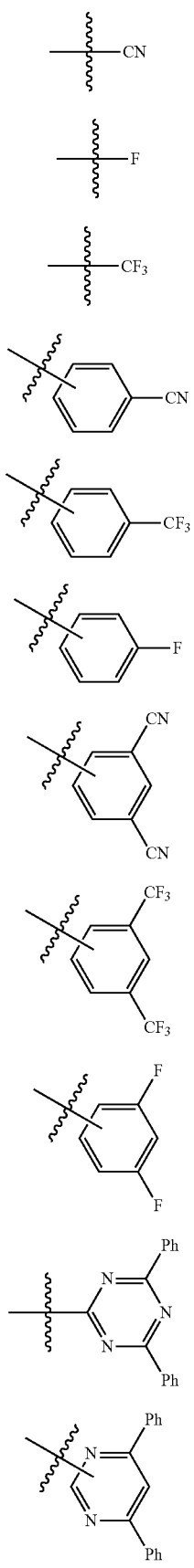

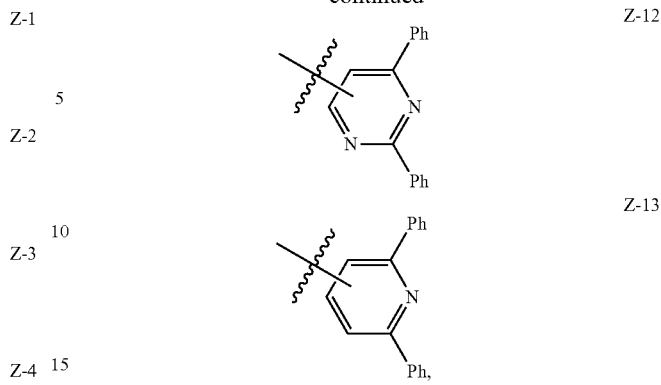

and
wherein in Z-10 to Z-13, Ph is a phenyl group.

7. The organic electroluminescence device of claim 1, wherein Formula 1 is represented by Formula 1-A or Formula 1-B:

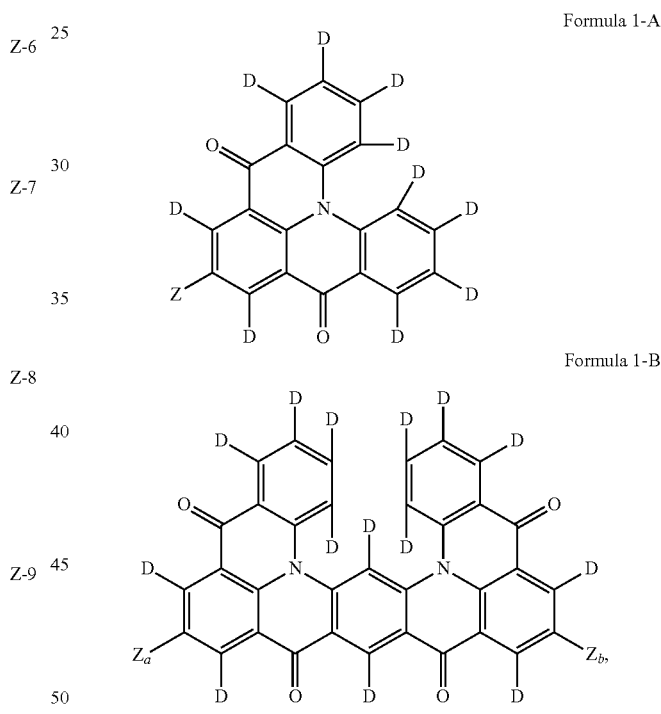

and
wherein in Formula 1-B,
$Z_a$ and $Z_b$ are each independently a substituent containing at least one fluorine group or at least one cyano group, or an aromatic ring group containing at least one nitrogen atom as a ring-forming atom, and
in Formula 1-A, Z is the same as defined in Formula 1.

8. The organic electroluminescence device of claim 1, further comprising a capping layer on the second electrode, the capping layer having a refractive index of about 1.6 or more.

9. The organic electroluminescence device of claim 1, wherein the emission layer is to emit delayed fluorescence.

10. The organic electroluminescence device of claim 1, wherein the emission layer is to emit light having a central wavelength of about 430 nm to about 470 nm.

11. The organic electroluminescence device of claim 1, wherein Formula 1 is any one of the compounds represented by Compound Group 1:
Compound Group 1
1
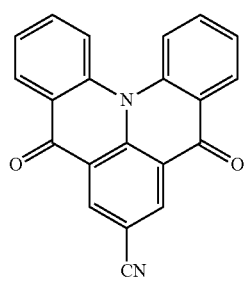
2
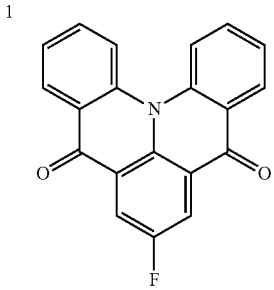
3
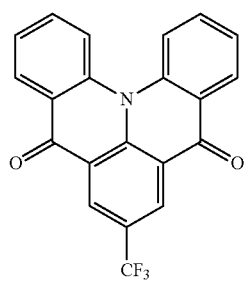
4
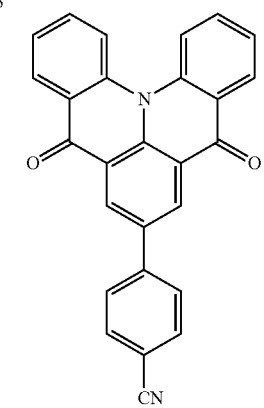
5
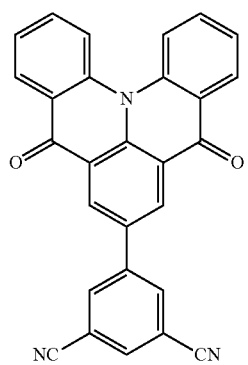
6
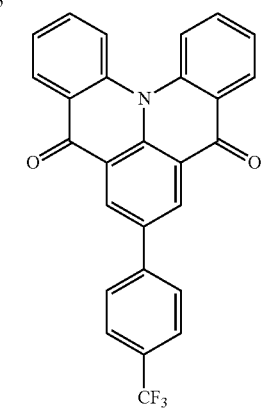
7
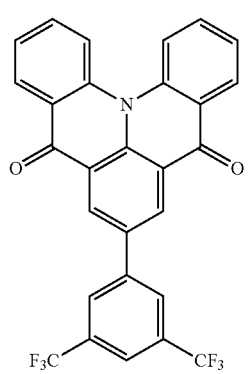
8
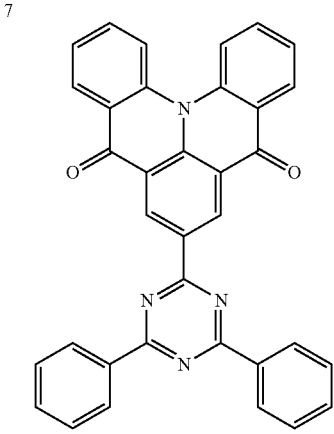

-continued
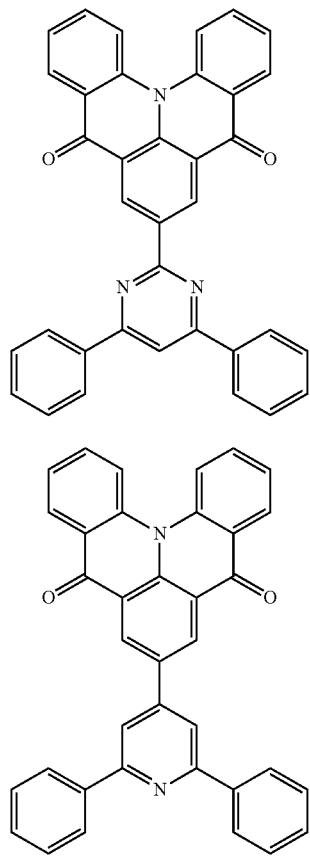
9
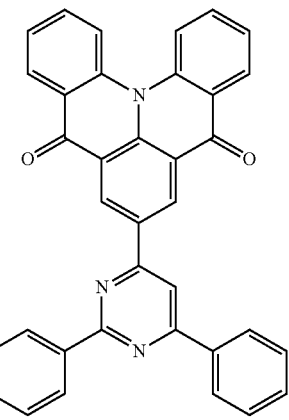
10
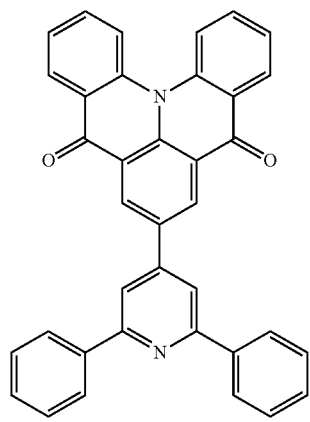
11
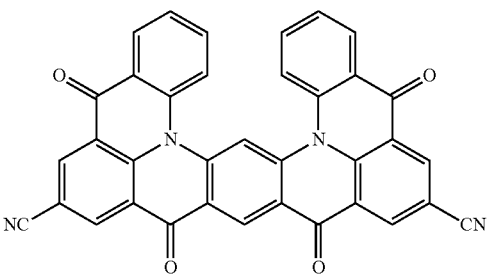
12
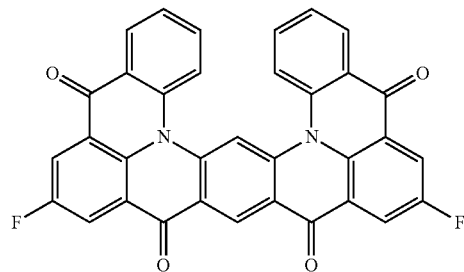
13
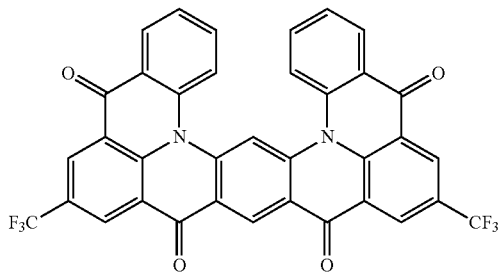
14
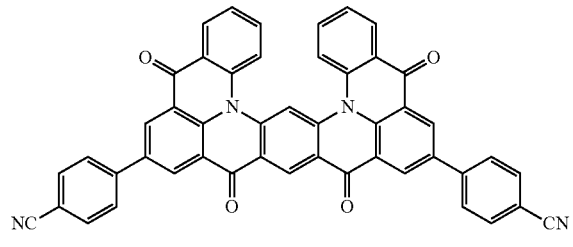
15
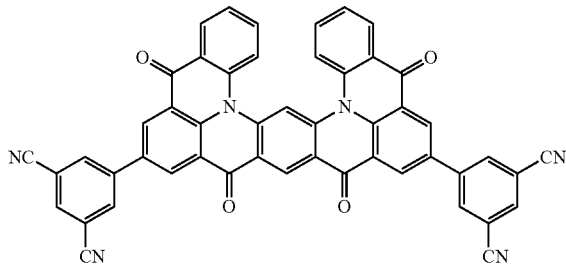
16

17
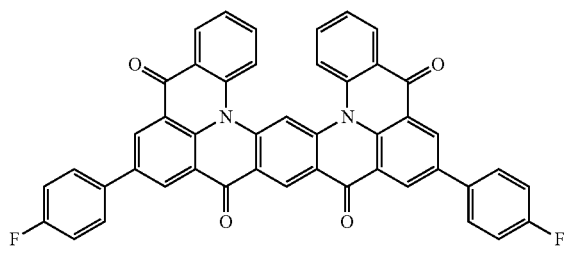
18
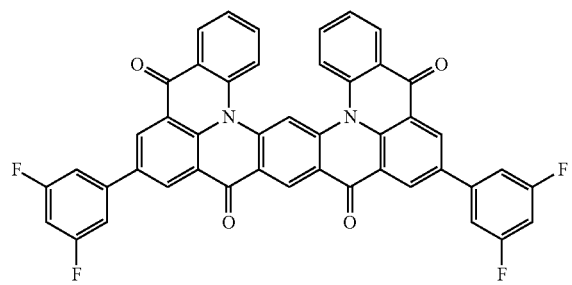
19
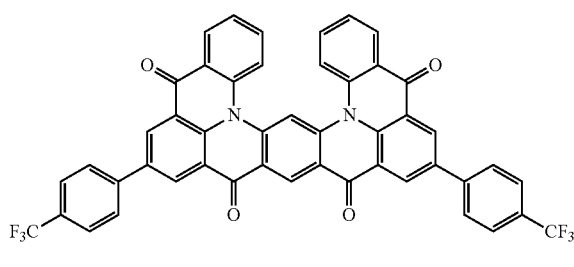
20
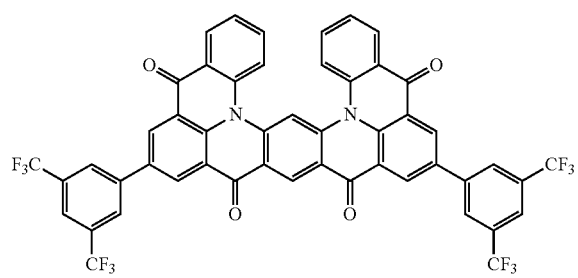
21
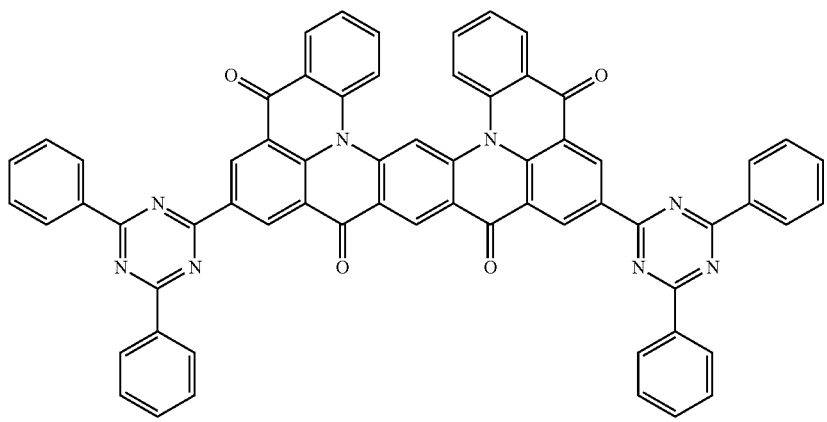
22
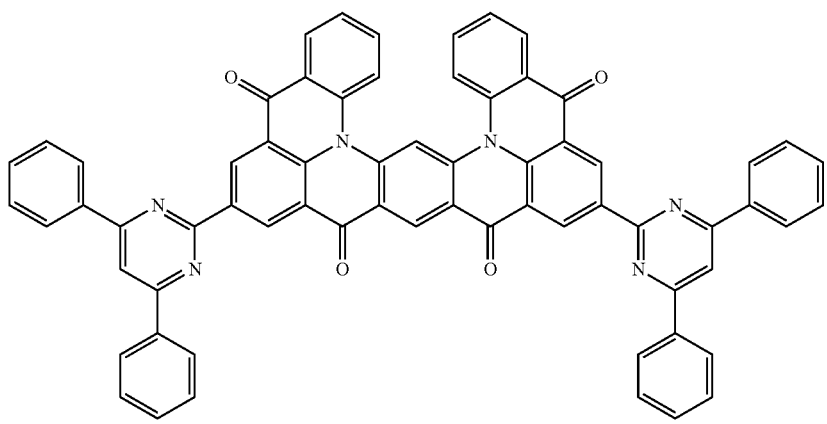

23
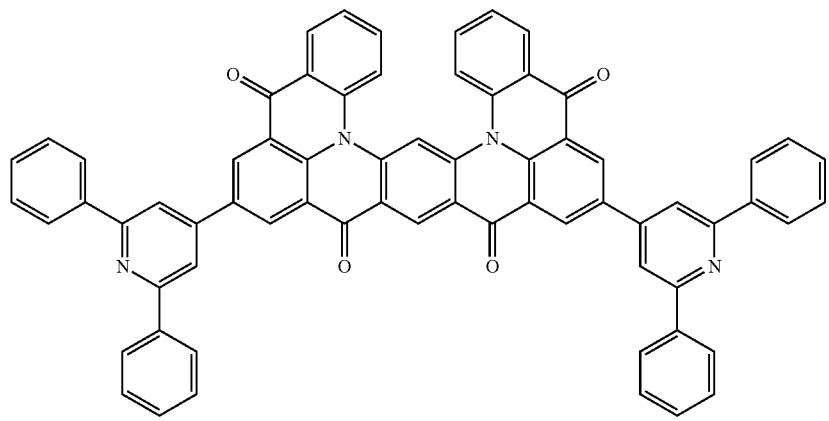
24
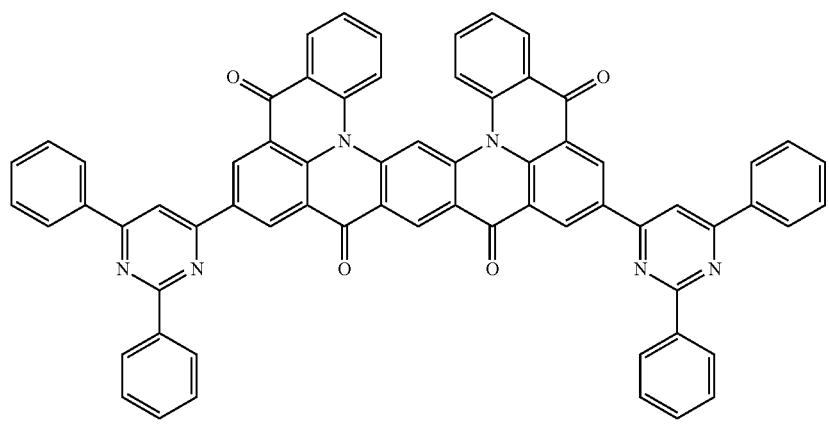
25
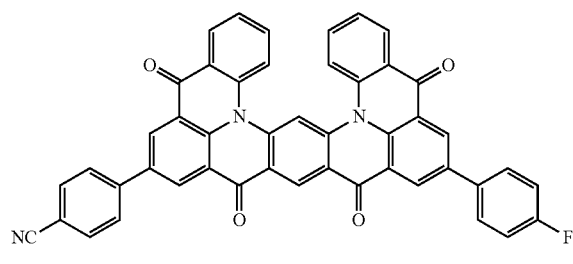
26
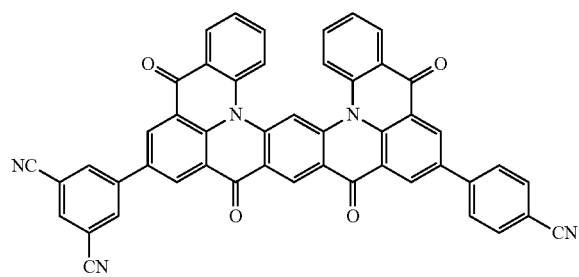
27
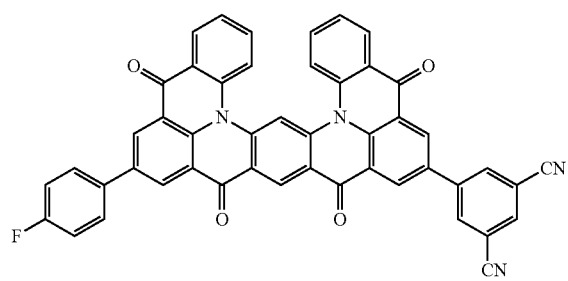
28
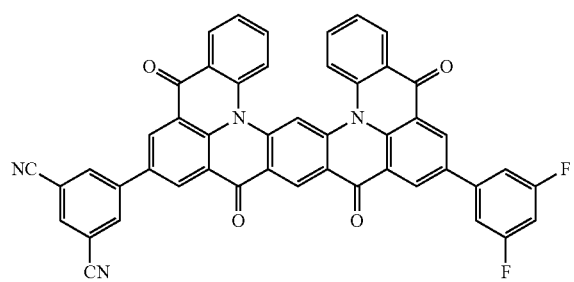

-continued
29
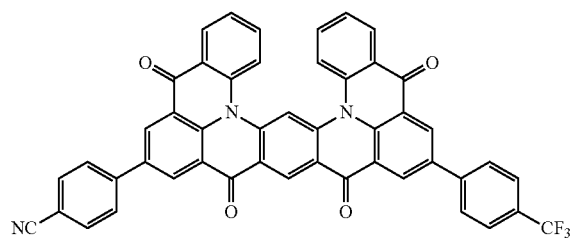
30
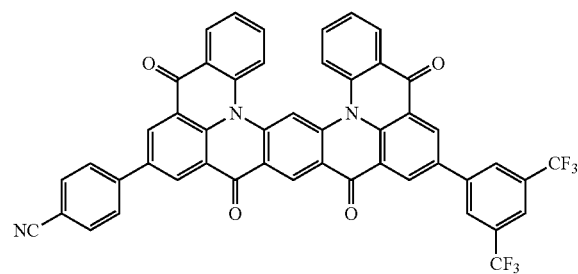
31
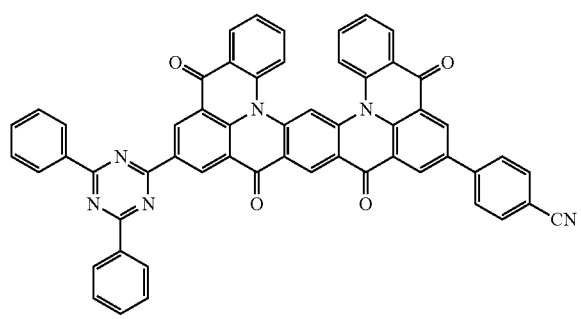
32
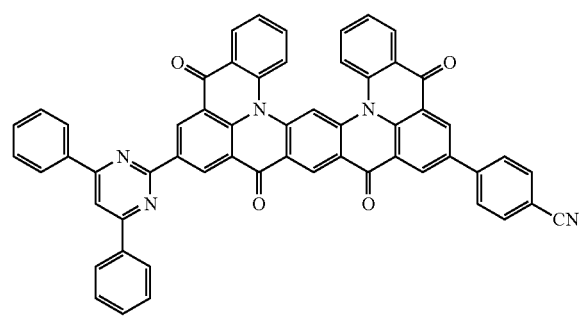
33
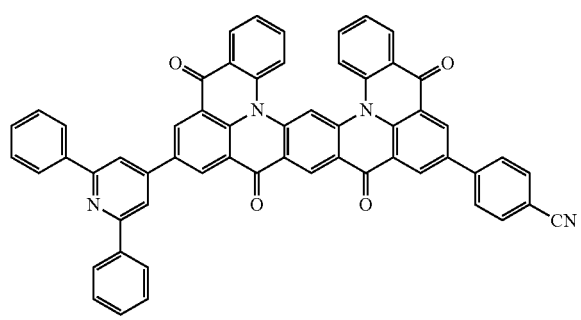
34
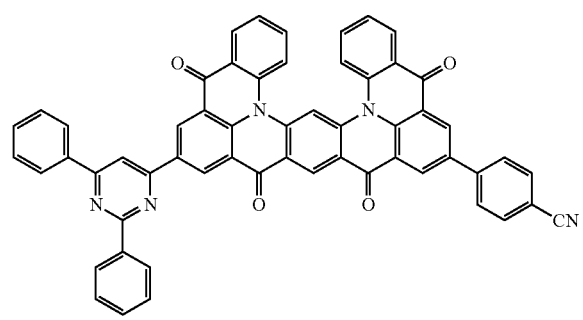
35
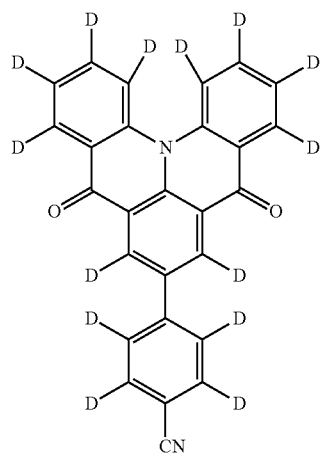
36
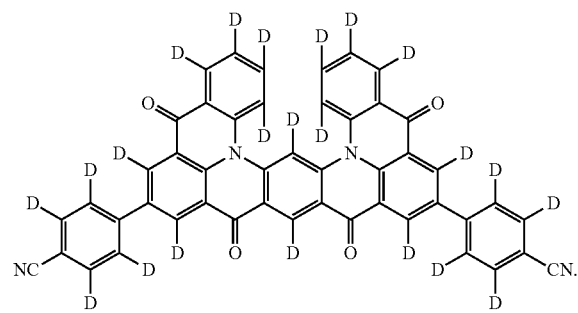

12. A polycyclic compound represented by Formula 1:

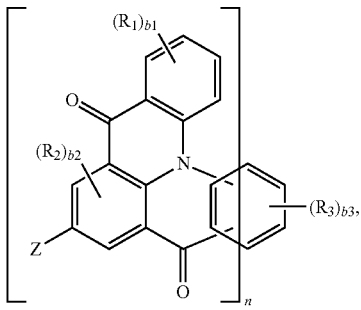

Formula 1 wherein in Formula 1, n is 1 or 2,

Z is a substituent containing at least one fluorine group or at least one cyano group, or an aromatic ring group containing at least one nitrogen atom as a ring-forming atom, b1 and b3 are each independently an integer of 1 to 4, b2 is 1 or 2, and $R_1$ to $R_3$ are each independently a hydrogen atom, a deuterium atom, a halogen atom, a substituted or unsubstituted oxy group, a substituted or unsubstituted alkyl group having 1 to 20 carbon atoms, a substituted or unsubstituted aryl group having 6 to 30 ring-forming carbon atoms, or a substituted or unsubstituted heteroaryl group having 3 to 30 ring-forming carbon atoms.

13. The polycyclic compound of claim 12, wherein Z is a cyano group, a fluorine group, an alkyl group substituted with at least one fluorine group, a phenyl group substituted with at least one cyano group or at least one trifluoromethyl group, a substituted or unsubstituted pyridine group, a substituted or unsubstituted pyrimidine group, or a substituted or unsubstituted triazine group.

14. The polycyclic compound of claim 12, wherein Formula 1 is represented by Formula 2 or Formula 3:

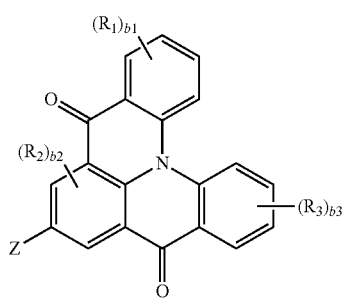

Formula 2

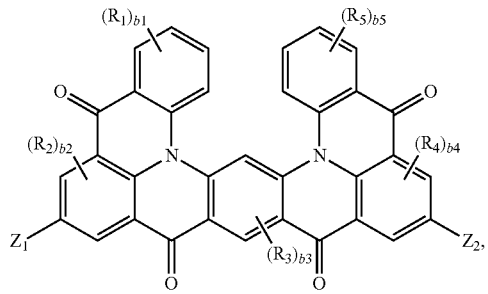

Formula 3 and wherein in Formula 3, $Z_1$ and $Z_2$ are each independently a substituent containing at least one fluorine group or at least one cyano group, or an aromatic ring group containing at least one nitrogen atom as a ring-forming atom, b4 is 1 or 2, b5 is an integer of 1 to 4, $R_4$ and $R_5$ are each independently a hydrogen atom, a deuterium atom, a halogen atom, a substituted or unsubstituted oxy group, a substituted or unsubstituted alkyl group having 1 to 20 carbon atoms, a substituted or unsubstituted aryl group having 6 to 30 ring-forming carbon atoms, or a substituted or unsubstituted heteroaryl group having 3 to 30 ring-forming carbon atoms, and in Formulae 2 and 3, b1 to b3, $R_1$ to $R_3$, and Z are each independently the same as defined in Formula 1.

15. The polycyclic compound of claim 14, wherein $Z_1$ and $Z_2$ are the same.

16. The polycyclic compound of claim 14, wherein Formula 2 is represented by Formula 2-1:

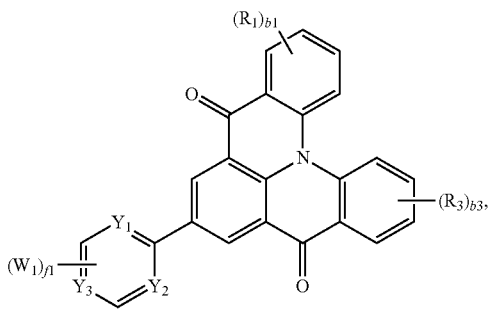

Formula 2-1 and wherein in Formula 2-1, f1 is 1 or 2, $Y_1$ to $Y_3$ are each independently a nitrogen atom or $CW_2$, $W_1$ and $W_2$ are each independently a hydrogen atom, a deuterium atom, a halogen atom, a cyano group, a substituted or unsubstituted alkyl group having 1 to 20 carbon atoms, or a substituted or unsubstituted aryl group having 6 to 30 ring-forming carbon atoms, and b1, b3, $R_1$ and $R_3$ are each independently the same as defined in Formula 2.

17. The polycyclic compound of claim 14, wherein Formula 3 is represented by Formula 3-1:

Formula 3-1

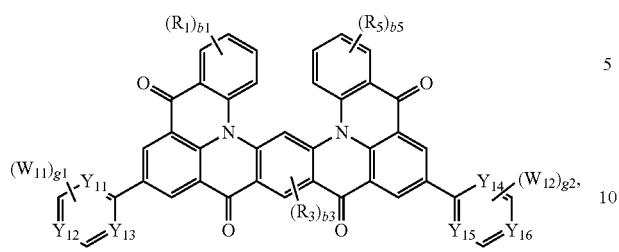

and wherein in Formula 3-1, $Y_{11}$ to $Y_{16}$ are each independently N or $CW_{13}$, g1 and g2 are each independently 1 or 2, $W_{11}$ to $W_{13}$ are each independently a hydrogen atom, a deuterium atom, a halogen atom, a cyano group, a substituted or unsubstituted alkyl group having 1 to 20 carbon atoms, or a substituted or unsubstituted aryl group having 6 to 30 ring-forming carbon atoms, and b1, b3, b5, $R_1$, $R_3$, and $R_5$ are each independently the same as defined in Formula 3.

18. The polycyclic compound of claim 12, wherein Z is represented by any one of Z-1 to Z-13:

Z-1
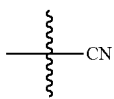

Z-2
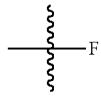

Z-3
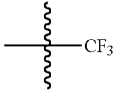

Z-4
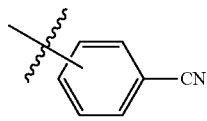

Z-5
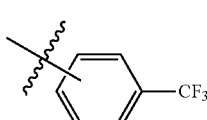

Z-6
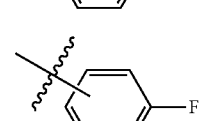

Z-7
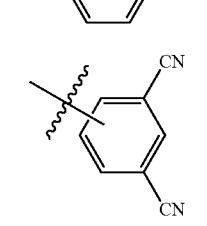

Z-8
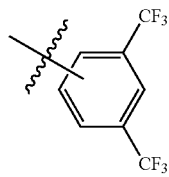

Z-9
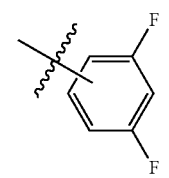

Z-10
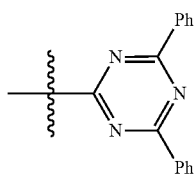

Z-11
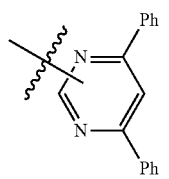

Z-12
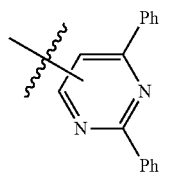

Z-13
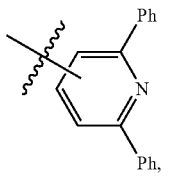

and wherein in Z-10 to Z-13, Ph is a phenyl group.

19. The polycyclic compound of claim 12, wherein Formula 1 is represented by Formula 1-A or Formula 1-B:

Formula 1-A

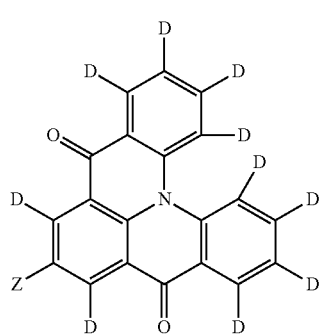

Formula 1-B

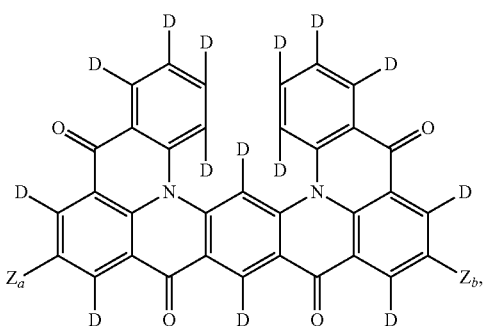

and wherein in Formula 1-B, $Z_a$ and $Z_b$ are each independently a substituent containing at least one fluorine group or at least one cyano group, or an aromatic ring group containing at least one nitrogen atom as a ring-forming atom, and in Formula 1-A, Z is the same as defined in Formula 1.

20. The polycyclic compound of claim 12, wherein Formula 1 is any one of the compounds represented by Compound Group 1:

Compound Group 1

1

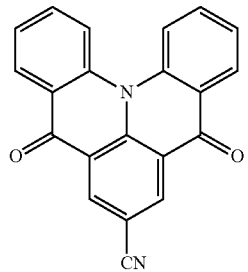

2

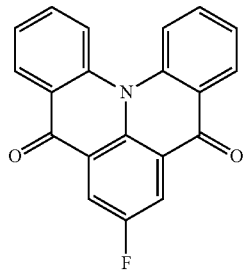

3

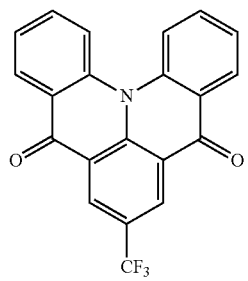

4

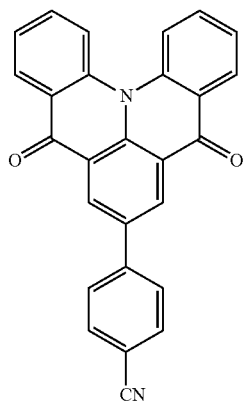

5

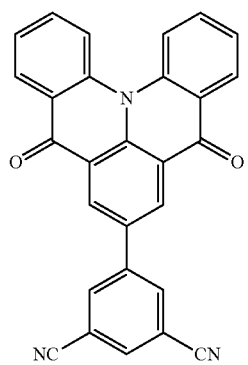

6

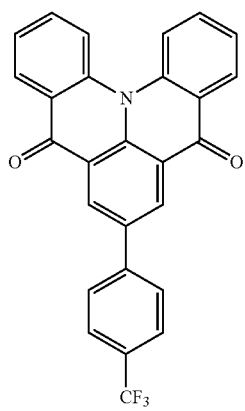

-continued
7
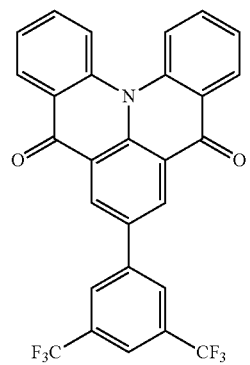
8
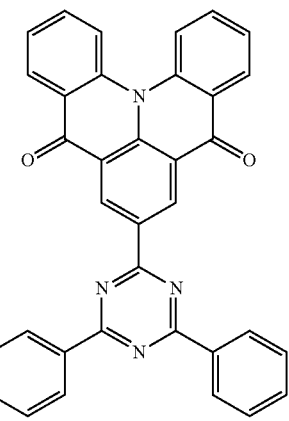
9
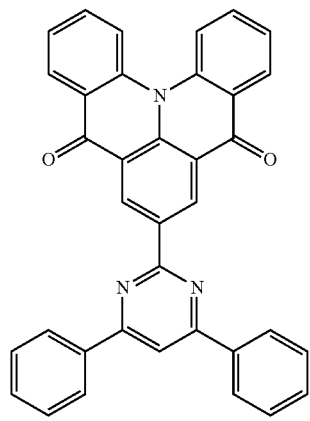
10
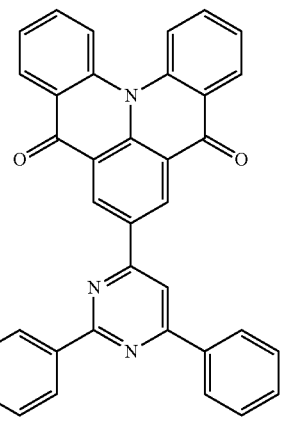
11
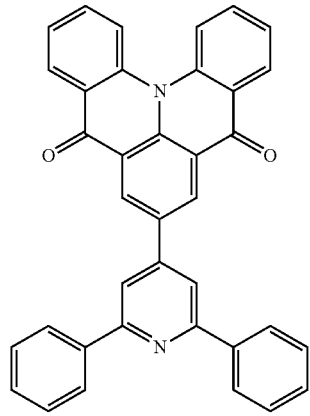
12
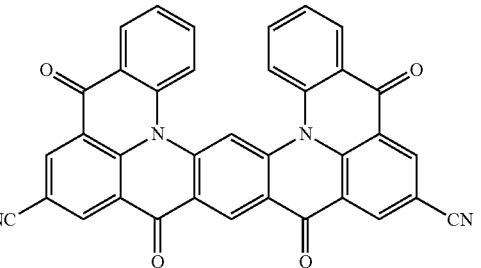
13
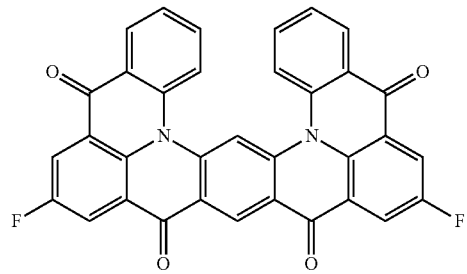
14
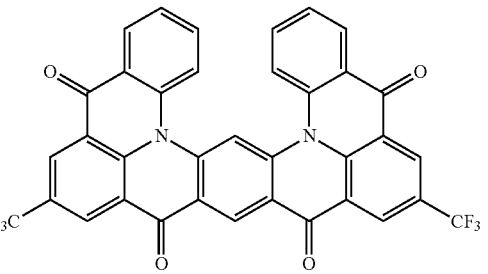

-continued
15
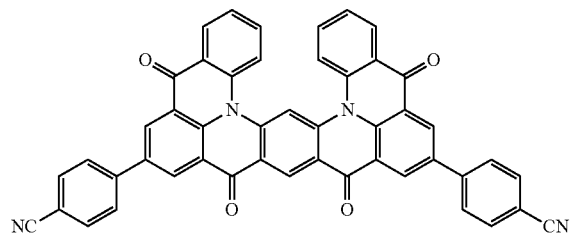
16
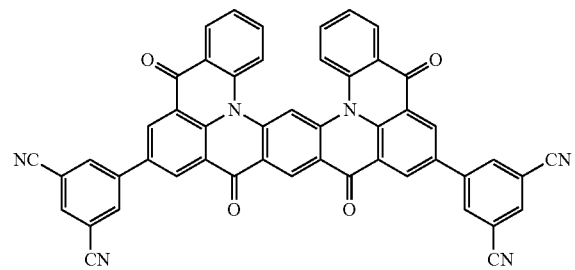
17
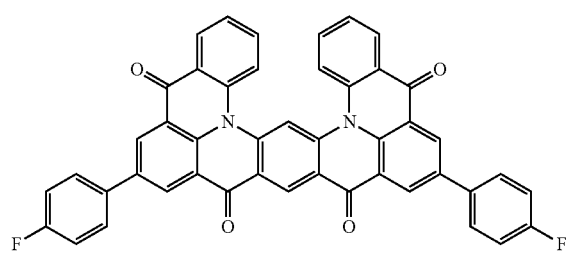
18
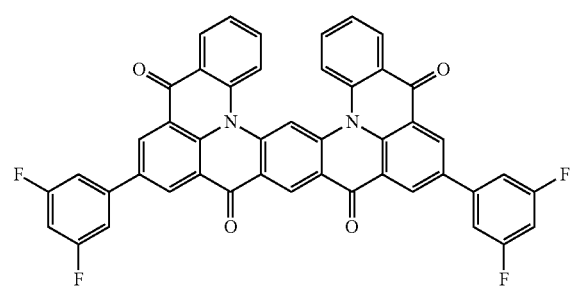
19
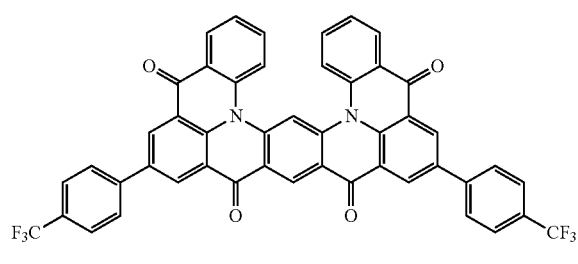
20
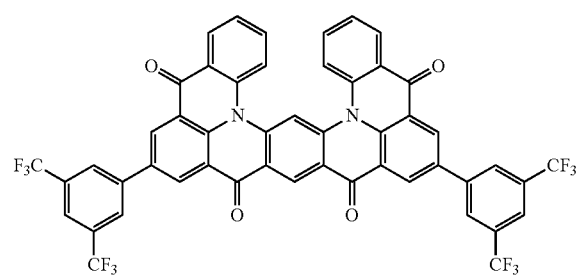
21
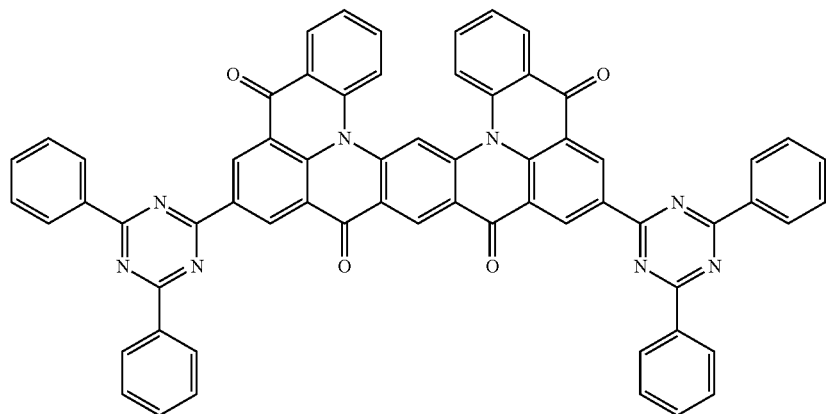

22
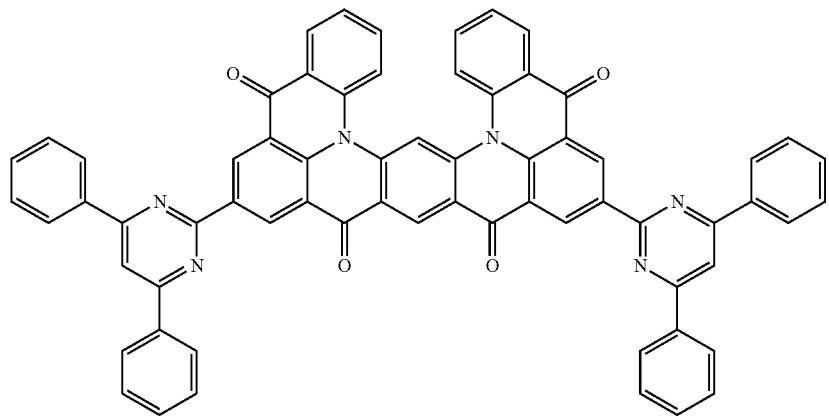
23
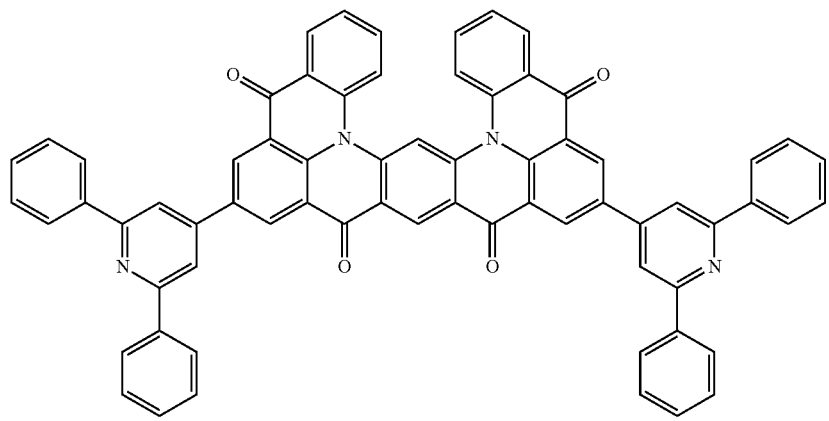
24
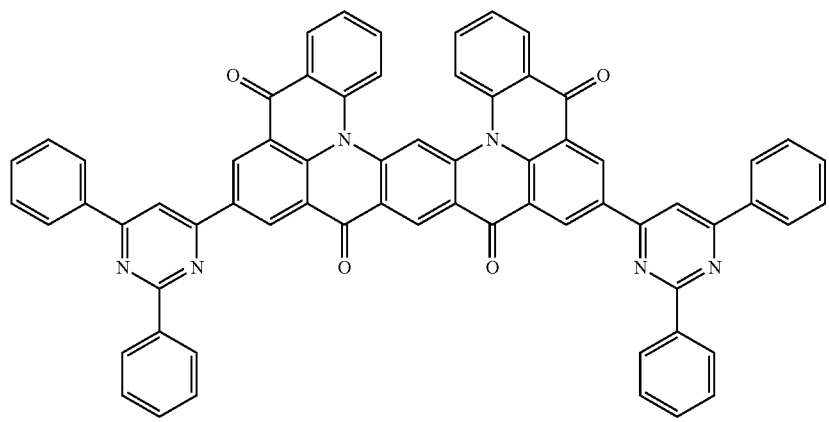
25 26
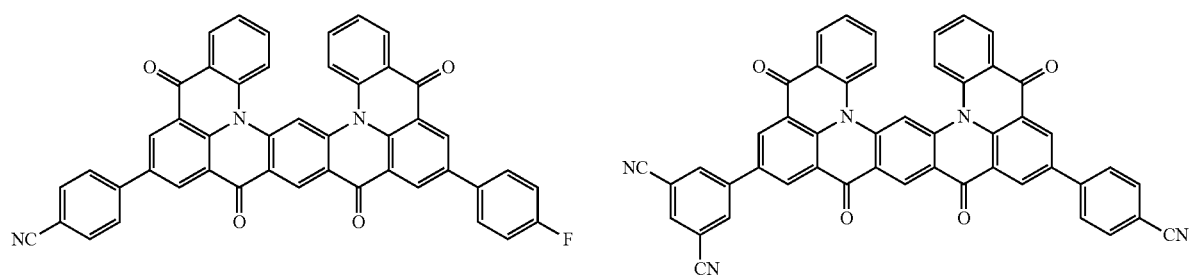

-continued
27
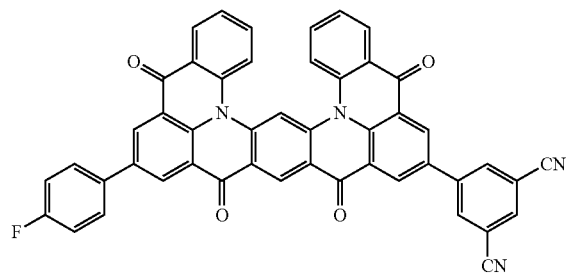
28
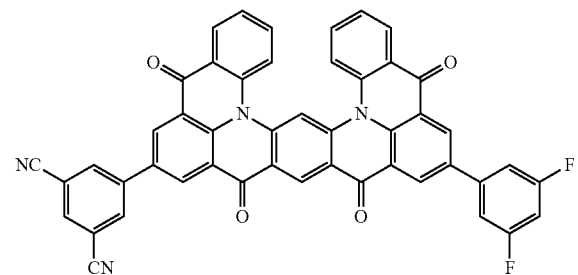
29
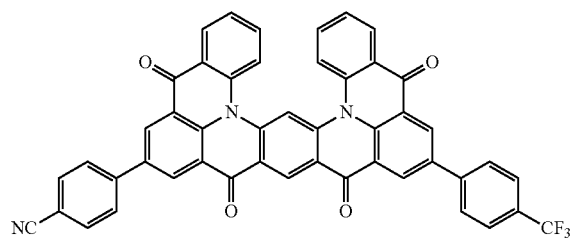
30
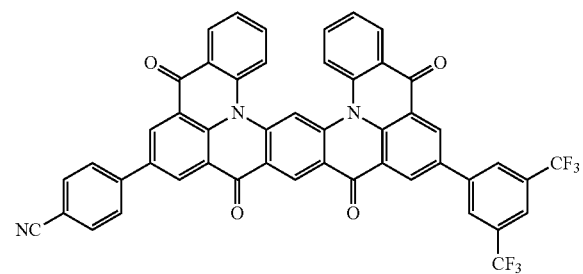
31
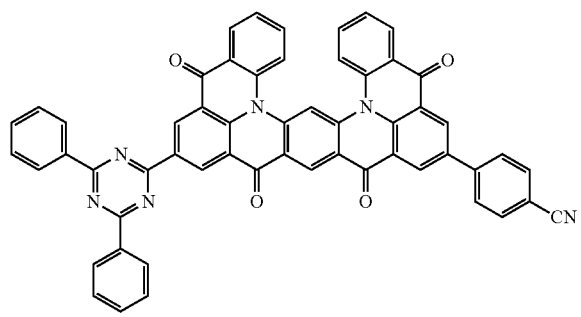
32
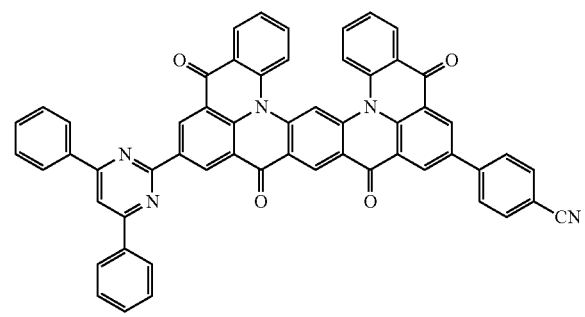
33
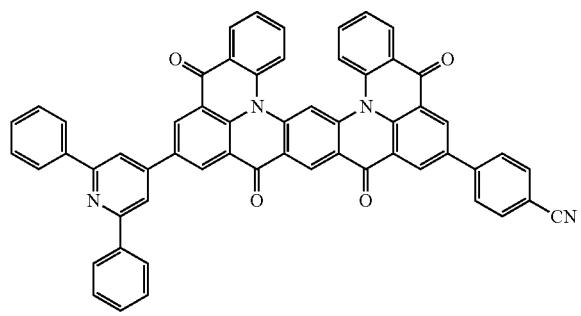
34
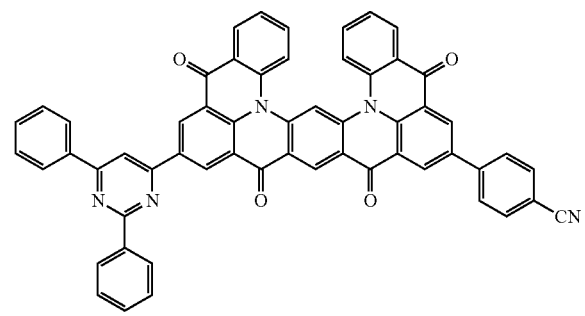

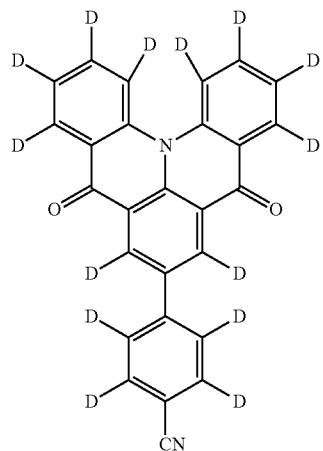
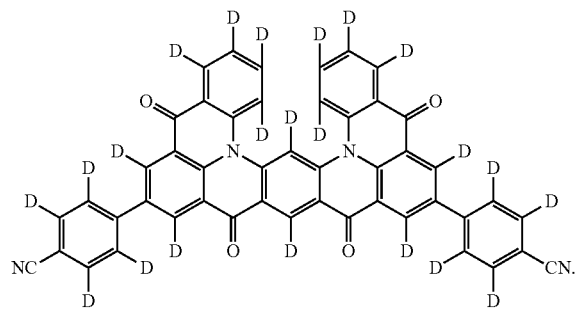
* * * * *